(12) United States Patent
Lee et al.

(10) Patent No.: US 8,264,903 B1
(45) Date of Patent: Sep. 11, 2012

(54) SYSTEMS AND METHODS FOR REFRESHING A MEMORY MODULE

(75) Inventors: Hyun Lee, Ladera Ranch, CA (US);
Jayesh R. Bhakta, Cerritos, CA (US)

(73) Assignee: Netlist, Inc., Irvine, CA (US)

( * ) Notice: Subject to any disclaimer, the term of this patent is extended or adjusted under 35 U.S.C. 154(b) by 283 days.

(21) Appl. No.: 12/774,632

(22) Filed: May 5, 2010

Related U.S. Application Data

(60) Provisional application No. 61/180,372, filed on May 21, 2009, provisional application No. 61/179,659, filed on May 19, 2009, provisional application No. 61/175,762, filed on May 5, 2009.

(51) Int. Cl.
*G11C 7/00* (2006.01)
(52) U.S. Cl. .................. 365/222; 365/194; 365/233.13
(58) Field of Classification Search .................. 365/222, 365/194, 233.13, 230.03, 233.1
See application file for complete search history.

(56) References Cited

U.S. PATENT DOCUMENTS 7,200,062 B2 * 4/2007 Kinsely et al. ................ 365/222

OTHER PUBLICATIONS

Bill Nale, "LR-DIMM Refresh Stagger," Intel®, dated May 4, 2009, in 5 pages.

* cited by examiner

*Primary Examiner* — David Lam
(74) *Attorney, Agent, or Firm* — Knobbe, Martens, Olson & Bear LLP

(57) ABSTRACT

A memory module according to certain aspects has a plurality of memory devices arranged into one or more logical ranks. Each logical rank may correspond to a set of at least two physical ranks. The memory module can include a circuit operatively coupled to the plurality of memory devices and configured to be operatively coupled to a memory controller of a computer system to receive a logical rank refresh command. In response, the circuit can initiate a first refresh operation for one or more first physical ranks and then initiate a second refresh operation for one or more second physical ranks. The memory module can further include a memory location storing a refresh time (tRFC) value accessible by the memory controller and based at least in part on a calculated maximum amount of time for refreshing the logical rank.

25 Claims, 15 Drawing Sheets

Two dimensional memory space constructed with 1Gb DRAMs

Tree dimensional memory space, constructed with 1Gb DRAMs
using A14 for the 3rd dimension Three dimensional memory space, constructed with 1Gb DRAMs using A14 an A15 for the 3rd dimension

FIG. 10

| Speed | tFAW(ns) | tFAW(ck) | tRC(ck) | tRP(ck) | tRAS(ck) | tRCD(ck) | #of ACT | #of PRE | #of CAS | #of open slot |
|---|---|---|---|---|---|---|---|---|---|---|
| 1333 | 30 | 20 | 32 | 8 | 24 | 8 | 4 | 4 | 6 | 6 |
|  |  |  | 33 | 9 | 24 | 9 |  |  |  |  |
|  |  |  | 34 | 10 | 24 | 10 |  |  |  |  |
| 1067 | 37.5 | 20 | 27 | 7 | 20 | 7 | 4 | 4 | 6 | 6 |
|  |  |  | 28 | 8 | 20 | 8 |  |  |  |  |
| 800 | 40 | 16 | 20 | 5 | 15 | 5 | 4 | 4 | 6 | 6 |
|  |  |  | 21 | 6 | 15 | 6 |  |  |  |  |

\# of open time slots = tFAW - (# of ACT) - (#o of PRE) - (# of CAS)
tRFC = refresh time needed for a logical rank = (refresh time needed for a rank on DIMM) x 2 - 20 (clock period).

a method of computing maximum tRFC for any size of DRAM

SYSTEMS AND METHODS FOR REFRESHING A MEMORY MODULE

CROSS-REFERENCE TO RELATED APPLICATIONS

This application claims the benefit of priority from U.S. Provisional Application Nos. 61/175,762, filed May 5, 2009, 61/179,659 filed May 19, 2009, and 61/180,372 filed May 21, 2009, each of which are incorporated in their entirety by reference herein.

FIELD OF THE DISCLOSURE

The present disclosure relates to the operation of memory modules. Specifically, the present disclosure relates to systems and methods for refreshing one or more memory devices of a memory module.

BACKGROUND OF THE DISCLOSURE

In general, the addressable memory space of a memory system can be defined by the number of available address bits and/or the number of available chip select signals.

The addressable memory space in a memory system can be generally characterized as a two dimensional memory space with two orthogonal dimensions wherein the first dimension is defined by a first set of one or more address bits, and the second dimension is defined by one or more chip select signals. For example, FIG. 1 schematically illustrates a memory system 100 having a conventional two-dimensional memory space architecture with a first set of 14 address bits and four chip select signals. The memory system 100 of FIG. 1 shows a configuration of a nibble or four-bit slice of memory space comprising four DRAM devices 102 (e.g., x4 DRAM devices). Each DRAM device receives a chip select signal and four chip select signals can uniquely access one of the four DRAM devices 102 with the common address and command signals.

Increasing the number of address bits generally expands the memory space of the first dimension of the address space, and increasing the number of chip select signals generally expands the memory space of the second dimension of the address space. For example, if a system memory controller supports a fixed number of chip select signals but can optionally support one or more additional address bits, the memory space for this example system memory controller can support higher density memory devices (e.g., dynamic random access memory devices or DRAM devices) because the additional address bits allow for accessing higher density memory devices. However, such an example system memory controller generally can not access more memory devices due to the fixed number of chip select signals because each memory device generally has a corresponding chip select signal.

SUMMARY

According to certain embodiments, a memory module is provided comprising a plurality of memory devices arranged into one or more logical ranks. Each logical rank may correspond to a set of at least two physical ranks. The memory module may comprise a circuit operatively coupled to the plurality of memory devices. The circuit may further be configured to be operatively coupled to a memory controller of a computer system to receive, for a logical rank of the one or more logical ranks, a logical rank refresh command generated by the memory controller. In response to the logical rank refresh command, the circuit can be configured to initiate a first refresh operation for one or more first physical ranks of the set of at least two physical ranks and a second refresh operation for one or more second physical ranks of the set of at least two physical ranks. In certain embodiments, the second refresh operation is initiated after the first refresh operation. The memory module may further comprise a memory location storing a refresh time (tRFC) value based at least in part on a calculated maximum amount of time for refreshing the logical rank. In certain embodiments, the tRFC value is accessible by the memory controller.

In certain embodiments, a method of using a memory module is provided. The method can include providing a memory module comprising a plurality of memory devices arranged into one or more logical ranks. Each logical rank may correspond to a set of at least two physical ranks, for example. The method can further include receiving a command to refresh a logical rank of the one or more logical ranks. In response to the command, the method can further include initiating a refresh operation for one or more first physical ranks of the set of physical ranks corresponding to the logical rank. In certain embodiments, the method also includes initiating a refresh operation for one or more second physical ranks of the set of physical ranks corresponding to the logical rank in response to the command. The method according to some embodiments also includes storing a refresh time (tRFC) value in a memory location of the memory module. The tRFC value can be based at least in part on a calculated maximum amount of time for refreshing the logical rank, for example. In certain embodiments, the tRFC value is accessible by the memory controller Another method of using a memory module is provided in some embodiments. The method can include accessing a refresh time (tRFC) value from a memory module comprising a plurality of memory devices arranged into one or more logical ranks. Each logical rank may corresponding to a set of at least two physical ranks, for example. The tRFC value can be based at least in part on a calculated maximum amount of time for refreshing the logical rank. The method of some embodiments includes transmitting a refresh command to the memory module instructing the memory module to refresh a logical rank of the one or more logical ranks. The refresh command can cause the memory module to initiate a refresh operation for one or more first physical ranks of the set of at least two physical ranks, for example. The refresh command can also cause the memory module to initiate a second refresh operation for one or more second physical ranks of the set of at least two physical ranks. In certain embodiments, the second refresh operation is initiated after the first refresh operation. After transmitting the refresh command to the memory module, the method can also include waiting for an amount of time corresponding to at least the tRFC value before issuing a subsequent refresh command to the memory module.

Certain embodiments described herein include an apparatus and a method of executing a refresh command in a memory system utilizing a first set of one or more address bits and one or more chip select signals, and further utilizing a second set of one or more address bits (e.g., one or more address bits different from those in the first set of address bits, such as one or more higher order address bits than in the first set of address bits), thereby adding a third dimension to the address space. For example, a first dimension may be accessed using the one or more chip select signals and a second dimension may be defined by and accessed using the first set of one or more address bits (e.g., lower address bits than in the second set of address bits used to access the third dimension of the address space). In certain embodiments, the address boundary of each dimension of the first, second, and third dimensions of the address space may represent a physical DRAM boundary.

Certain embodiments described herein are configured to refresh one or more memory (e.g., DRAM) devices of a memory system including a three dimensional memory space such as a memory system where the first dimension of the memory system is accessed using a first set of address bits, a second dimension of the memory system is accessed using one or more chip select signals, and a third dimension of the memory space is accessed using a second set of address bits (e.g., one or more address bits different from those in the first set of address bits, such as one or more address bits of a higher order than the address bits in the first set).

Certain embodiments provide a method for executing the DRAM refresh command in an expanded memory space where the expansion is based on the second set of one or more memory address bits. In addition, certain embodiments described herein are advantageously configured to stagger or serialize the execution of a refresh command for one or more memory (e.g., DRAM) devices of a memory system having an expanded memory space in which the expansion is based on the second set of one or more memory address bits (e.g., in a three dimensional memory space). In general, the second set of address bits is not limited to the conventional sense of address bits. In certain embodiments, the second set of address bits may comprise one or more predetermined signals used to partition the memory space. For example, in a system with more than one memory module, the second set of address bits may comprise one or more predetermined signals shared by each of the memory modules in the system and which are used to partition the memory space. The second set of address bits may comprise one or more higher order address bits, one or more lower order address bits, one or more non-address signals (e.g., chip select signal, read/write signal), and the like.

Certain embodiments described herein are advantageously further configured to avoid, reduce, or minimize signal conflicts (e.g., address and command signal conflicts) which may otherwise occur during the execution of the refresh command for memory systems including a three dimensional memory space as described herein.

Certain embodiments described herein describe a system wherein a component (e.g., a local memory controller) repeats or sequentially issues refresh commands a number of times corresponding to or equal to the size of the third dimension of the memory space. For example, in certain embodiments, the system comprises a memory module comprising the component, and the size of the third dimension corresponds to a number of physical ranks associated with each logical rank of the memory module. In certain embodiments, the refresh commands generated by the component are delayed or staged so as to not conflict with commands issued by a system memory controller (e.g., read or write commands) while the refresh commands are being executed.

Memory systems and subsystems compatible with certain embodiments described herein use the DDR3 memory interface protocol. Additionally, in various embodiments, embodiments described herein are compatible with DDR, DDR2, or other memory interface protocols.

BRIEF DESCRIPTION OF THE DRAWINGS

FIG. 10 is a table showing example command sequences of an example system and including an example scenario illustrating the maximum number of consecutive commands that a system memory controller can issue to a logical memory rank for a given tFAW and operation speed, in accordance with certain embodiments described herein.

Like elements and components may bear the same designations and numbering throughout the application. This is done for purposes of clarity and brevity and is not intended to be limiting.

DETAILED DESCRIPTION

In certain embodiments, an electronic system may benefit from a larger memory system or subsystems (e.g., memory modules) having a relatively large memory space but which includes one or more relatively low density memory devices (e.g., because relatively higher density memory devices are either not readily available or are costly). If the signal timing protocol between the address signals and the chip select signals are the same, a second set of one or more address bits (e.g., one or more address bits different from those in the first set of address lists, such as one or more higher order address bits) can be used to expand the size of the memory subsystem by adding a third dimension to the address space with the higher address bits.

In such cases, a second set of one or more additional address bits (e.g., one or more address bits different from those in the first set of address bits, such as higher order address bits than in a first set of address bits) can be used to expand the size of the memory system or subsystem (e.g., memory module) as described herein. In general, the second set of address bits are not limited to the conventional sense of address bits. In certain embodiments, the second set of address bits may comprise one or more predetermined signals used to partition the memory space. For example, in a system with more than one memory module, the second set of address bits may comprise one or more predetermined signals shared by each of the memory modules in the system and which are used to partition the memory space. The second set of address bits may comprise one or more higher order address bits, one or more lower order address bits, one or more non-address signals (e.g., chip select signal, read/write signal), and the like. The additional address space may be characterized as a third dimension of the overall address space defined or accessed by the second set of address bits. As used herein, the term "dimension" has its broadest reasonable interpretation, including but not limited to, a portion of the available memory space of the memory module which is defined, addressed, or accessed by a set of bits, which can be unique to the corresponding dimension.

Figure 2:
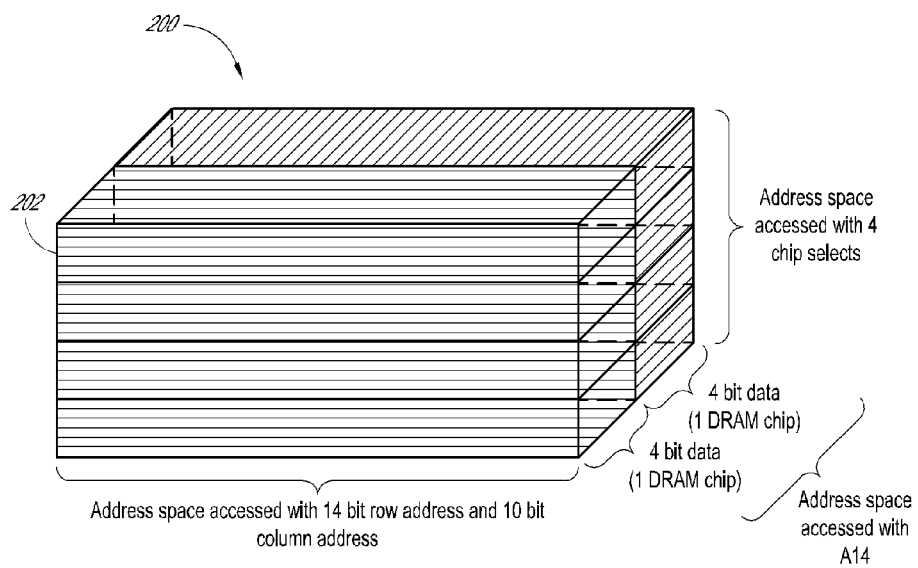
FIG. 2 schematically illustrates an example memory system including a three dimensional memory space.

The addition of the third dimension may be characterized as segmenting the address space that is covered by a single chip select into sub-spaces that can be addressed with the second set of address bits. For example, in one embodiment, the memory space can be configured in a 2×1×4 memory space organization, corresponding to four memory (e.g., 1 Gb DRAM) devices in the first dimension and a depth of two in the third dimension. FIG. 2 schematically illustrates an example memory system 200 including a three dimensional memory space having a third dimension (e.g., orthogonal to the first and second dimensions) that is mapped with a second set of one or more address bits (e.g., A14) in accordance with certain embodiments described herein. The third dimension of the memory system 200 of FIG. 2 has a depth of two corresponding to or accessed by one higher order address bit (A14).

As schematically illustrated in FIG. 2, the first set of address bits comprises 14 lower order address bits, and the third dimension of certain embodiments can be accessed using the second set of address bits (e.g., comprising the address bit A14). In the example shown in FIG. 2, each of eight memory devices 202 can be uniquely accessed by a combination of the four chip select signals in combination with A14. Although A14 is used as the higher order address signal used to access the third dimension to expand the memory space of FIG. 2, other signals such as other address signals or non-address signals can be used in various embodiments. In certain embodiments, the memory system 200 may include other memory devices and configurations. For example, the memory system 200 may include differently sized data slices (e.g., two, four, eight, or 16 bit data slices) and corresponding memories (e.g., memories having two, four, eight, or 16 bit data widths) in other configurations.

Figure 3:
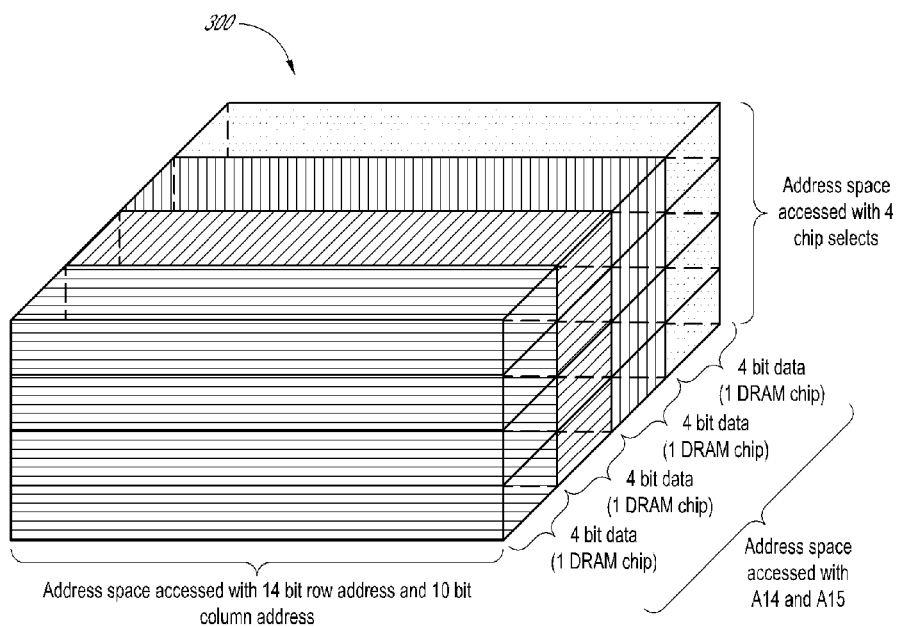
FIG. 3 schematically illustrates another example memory system including a three dimensional memory space.

For another example, in one embodiment, the memory space can be configured in a 4×1×4 memory space organization, corresponding to four memory (e.g., DRAM) devices in the first dimension and a depth of four in the third dimension. FIG. 3 schematically illustrates a memory system 300 including a three dimensional memory space. The memory system 300 includes a third orthogonal dimension such that the third dimension is mapped with a second set of one or more higher order address bits (e.g., A14 and A15). The memory system of FIG. 3 includes a first set of 14 lower order address bits, a second set of two higher order address bits A14 and A15, and four chips select signals. For example, the second set of address bits and the chip-select signals can together target or address each individual physical rank of the memory system.

The memory system 300 of FIG. 3 has a third dimension with a depth of four corresponding to the two higher order address bits. Although the third dimension of certain embodiments can be expanded with address A14 and A15, in certain other embodiments, other signals such as other address signals or non-address signals can be used. The first set of address signals, the second set of address signals, and the chip select signals can be combined in certain embodiments to individually access each of sixteen memory (e.g., DRAM) devices of the memory system (e.g., memory module) of FIG. 3. The address memory space can be indefinitely expanded in this way without increasing the number of chip select signals. In some embodiments, the technique of creating a three dimensional memory space may be referred or characterized as bijectionally mapping a contiguous logical memory space into multiple disjointed physical memory spaces.

In some embodiments, the addressable memory space of the memory system or subsystem (e.g., memory module) is expanded by increasing the number of memory devices, and the addition of the third dimension by using the second set of one or more address bits is used to access the expanded memory space. For example, the addressable memory system is expanded where the additional memory devices each comprise the same amount of addressable memory space as each of the original memory devices (e.g., as shown in FIG. 2 and FIG. 3). In various embodiments, the number of memory devices can be generally expanded without increasing the number of chip select signals coming from the system memory controller by using additional address bits to access additional memory devices in the third dimension of the address space.

In other embodiments, the additional memory devices do not expand the addressable memory space of the memory system. For example, the addressable memory space is not expanded where an increased number of memory devices, each comprising a relatively smaller addressable memory space, replace a smaller number of memory devices, each comprising a relatively larger addressable memory space. This technique may generally be referred to as "rank hiding." In certain such embodiments, the third dimension is used to access the addressable memory space.

Figure 4:
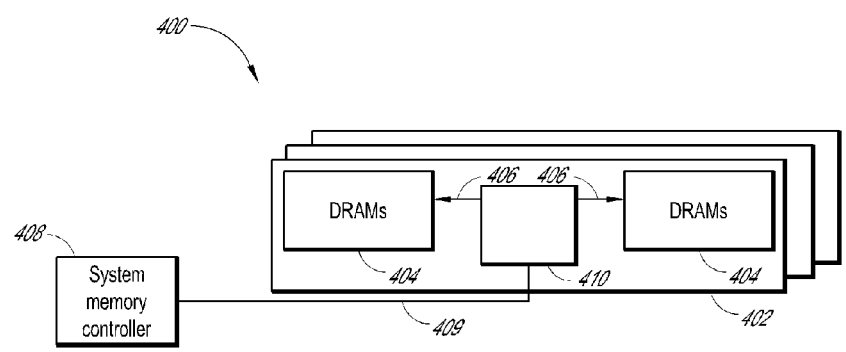
FIG. 4 is a block diagram illustrating an example system including multiple memory modules wherein each memory module includes multiple ranks in accordance with certain embodiments described herein.

FIG. 4 is a block diagram illustrating an example system 400 including multiple memory modules 402 (e.g., dual inline memory modules or DIMMs) wherein each memory module 402 includes multiple ranks 404 in accordance with certain embodiments described herein. The memory system 400 of FIG. 4 comprises two ranks 404 of memory (e.g., DRAM) devices which can be activated by a corresponding chip select signal 406 of two chip select signals. The chip select signals 406 may be used to uniquely access each rank, for example. In an example scenario, a memory controller 408 of a computer system accesses one of the ranks 404 of the memory module 400 by asserting a chip select signal on the bus 409 corresponding to the desired rank 404. For example, in the embodiment of FIG. 4, the bus 409 includes two chip select signals coupled to the memory module 400, wherein each chip select signal on the bus 409 corresponds to one of the two ranks 404. The memory module 400 includes a local memory controller 410 coupled to the bus 409 or a portion thereof, allowing communication between the memory module 400 and the memory controller 408. The circuit 410 receives the asserted chip select signal from the memory controller over the bus 409 and asserts the corresponding local chip select signal 406 to access the selected rank 404.

The term "physical rank" as used herein refers generally to an independently accessible memory module rank physically coupled to (e.g., residing on) a memory module (e.g., from the point of view of the local memory controller). The term "logical rank" as used herein, on the other hand, refers to an independently accessible memory module rank from the point of view of the system memory controller. The number of logical ranks in certain embodiments generally corresponds to the number of chip select signals communicated to the memory modules by the system memory controller. As an example, the system 400 of FIG. 4 has two independently accessible ranks from the point of view of the memory controller 408 (i.e., two logical ranks) and corresponding to two chip select signals on the bus 409. Moreover, there are two independently accessible ranks 404 physically residing on the memory module (i.e., two physical ranks) corresponding to the two local chip select signals 406.

Figure 5:
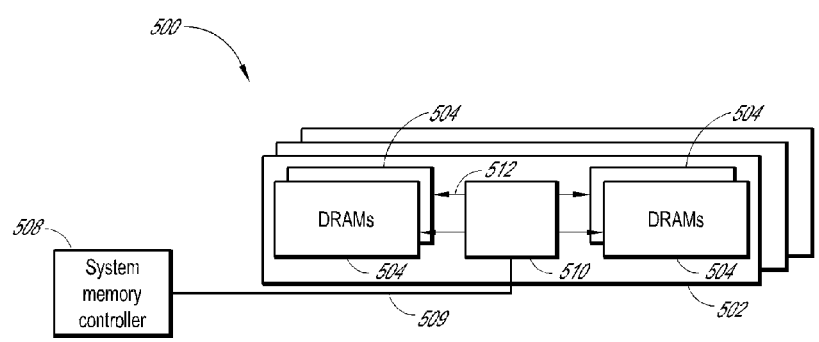
FIG. 5 is a block diagram illustrating an example system including a three dimensional memory space including multiple memory modules having multiple physical ranks per logical rank in accordance with certain embodiments described herein.

FIG. 5 is a block diagram illustrating another example system 500 including multiple memory modules 502 (e.g., DIMMs) wherein each memory module 502 includes a first number of logical ranks and a second number of physical ranks 504, larger than the first number, in accordance with certain embodiments described herein. The example system 500 of FIG. 5 may be characterized as a three dimensional memory space including four physical ranks 504 (e.g., four independently accessible ranks physically coupled to or residing on the memory module) seen as two logical ranks from the point of view of the system memory controller. Each module 502 includes a local memory controller 510 (e.g., a memory controller physically coupled to or residing on the memory module) which translates a first number of chip select signals and one or more address bits received from the system memory controller via a bus interface 509 to create a second number of chip select signals. The second number of chip select signals can be larger (e.g., twice) the first number.

The memory modules 502 may comprise one or more DIMMs each comprising four ranks of memory (e.g., DRAM) devices, for example. In the example system 500, the four physical ranks 504 may be individually selectable via two chip select signals and an address bit (e.g., a high order address bit) provided by a system memory controller over the bus 509 as described herein (see, also, U.S. Pat. No. 7,289, 386 and U.S. Pat. Appl Publ. No. 2006/0262586 A1, each of which is incorporated in its entirety by reference herein). For example, the two chip select signals and the address bit may be translated by a local memory controller 510 of the memory module 502 to create four local chip select signals 512 to individually access each rank on the memory module 502. As described above (e.g., with respect to FIGS. 2, 3 and 4) and as shown in the example configuration of FIG. 5, the number of logical ranks of the memory module 502 from the point of view of the system memory controller 508 generally corresponds to the number of chip select signals generated by the system memory controller (e.g., two chip select signals corresponding to two logical ranks in the embodiment of FIG. 5). The number of physical ranks 504 on the memory module 502, on the other hand, is larger than the number of logical ranks because the local memory controller 510 decodes the chip select signals and the second set of one or more additional address signals received from the system memory controller 508 into an increased number of local chip select signals (e.g., four chip select signals corresponding to four physical ranks 504 in the embodiment of FIG. 5). However, regardless of the actual number of ranks 504 on the memory module 500, from the point of view of the system memory controller 508, all ranks on the memory module 502 correspond to one of the smaller number of chip select signals (e.g., one of the two chip select signals of the memory system of FIG. 5) coming from the system memory controller 508.

The technique described with respect to FIGS. 2 3, and 5 of defining a third dimension of the memory space by increasing the number of address bits (e.g., higher order bits) may introduce complexity to the operation of the memory system (e.g., the refresh operation). For example, an electrical issue may occur during the refresh period since all the memory devices in the third dimension (e.g., as in FIG. 2) are refreshed with a single refresh command from the system memory controller. Increasing the addressable memory space by increasing the number of memory (e.g., DRAM) devices also increases the peak current and/or power demand in the memory subsystem. In some cases, the peak current and/or power can be reduced or moderated by putting unaccessed memory devices in the inactive (e.g., quiescent stand-by) mode, except the one or more memory devices that are currently being accessed by the system memory controller. However, since the refresh command should generally be executed for every memory device that shares the same chip select signal, the peak current and/or power for executing the refresh command in configurations where more than one DRAM device shares the same chip select signal can become relatively large. In general, there are at least two ways of handling the refresh command.

Figure 1:
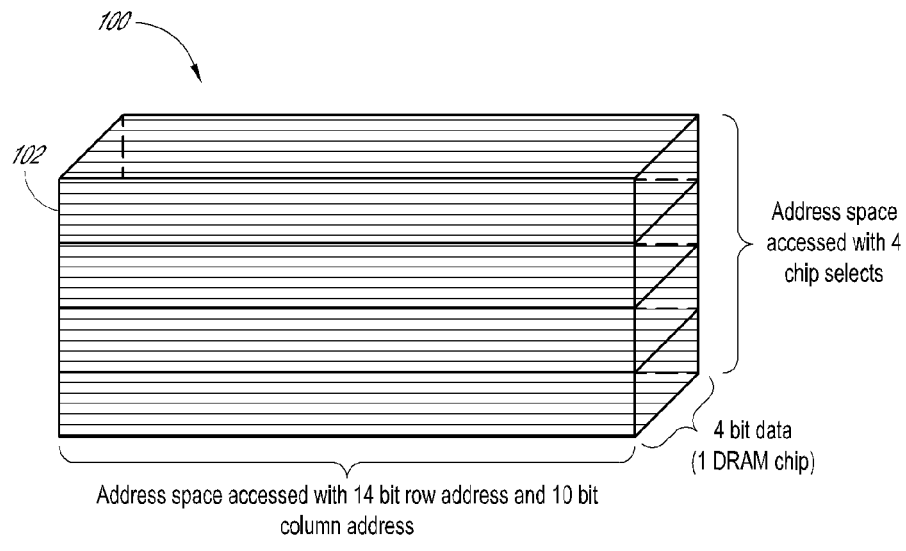
FIG. 1 schematically illustrates a memory system including a two-dimensional memory space wherein the memory space is generally partitioned into two orthogonal dimensions such that one of the memory dimensions is mapped with a first set of one or more address bits and the other memory dimension is mapped with one or more chip select signals.

A first way of handling the refresh command is to execute (e.g., by the local memory controller of the memory module) the refresh commands for the separate memory devices in the third dimension (e.g., for each physical rank corresponding to a logical rank) simultaneously or substantially simultaneously. Issuing simultaneous refresh commands may lead to a relatively large or excessive refresh current because more memory devices are refreshed simultaneously than in a two-dimensional implementation. For example, twice the number of memory devices are refreshed simultaneously in the three-dimensional embodiment of FIG. 2 than in the two-dimensional embodiment of FIG. 1. This may adversely affect the power supply voltage (e.g., cause the power supply voltage to glitch to below a specified or allowed level). For example, in an expanded memory system such as the memory system of FIG. 5 where an increased number of memory devices are included, the refresh current and/or power may be relatively large if all of the memory devices connected to a particular chip select signal coming from the system memory controller are refreshed simultaneously. Thus, simultaneous refreshing of each of the memory devices of a logical rank in a three dimensional memory space may cause undesired behavior such as supply voltage glitching.

In addition, the refresh current for the memory devices generally does not scale linearly with the DRAM density. For example, a 1 Gb DRAM draws about 200 mA refresh current while a 2 Gb DRAM draws about 275 mA of refresh current. As such, the example memory system of FIG. 2 draws about 200 mA of refresh current per DRAM (400 mA total) when two 1 Gb DRAMs are used in place of one 2 Gb DRAM by generating the increased number of local chip select signals using address bit A14. As such, the overall refresh current increases even in a situation where there the total memory space remains the same but the number of DRAM devices and/or physical ranks is increased by using an address bit or other signal to create a three dimensional memory space as described herein (e.g., in a rank hiding configuration). Thus, due to the excessive increase in the refresh power requirement, the refresh command from the system memory controller cannot be executed on all physical ranks which share a common chip select signal.

In some cases, memory subsystem designers may add a decoupling capacitor to the system to attempt to minimize the effect of the increased refresh current on the supply voltage (e.g., to minimize glitching of the supply voltage). However, because the refresh operation involves a short duration of relatively high current, this solution may be difficult to implement or may be costly. For example, in certain embodiments the amount of capacitance corresponding to an acceptable reduction of supply voltage glitching is prohibitively large (e.g., on the order of 100 millifarads).

In accordance with certain embodiments described herein, a second way of handling the refresh command is to execute (e.g., by the local memory controller of the memory module) the refresh commands for the memory devices in the third dimension in series or in a staggered fashion. In certain embodiments, the system memory controller issues one refresh command for a logical rank, and in response, the local memory controller issues subsequent refresh commands in series or in a staggered fashion. Issuing refresh commands in this manner will generally not lead to the same relatively large amount of refresh current and corresponding effect on the supply voltage as does issuing the refresh commands simultaneously because the resulting refresh current is spread out over a longer period of time. For example, FIG. 4 shows one set of DRAM devices (e.g., two ranks) with one control signal from the local memory controller. FIG. 5 shows two sets of DRAM devices with two control signals from the local memory controller. In general, embodiments described herein are described as being capable of refreshing components of a memory system (e.g., a plurality of physical ranks of a memory module) in a "serialized," "staggered," "staged," or "sequentialized" fashion. These terms are used generally interchangeably throughout the disclosure and not intended to be limiting.

Figure 6:
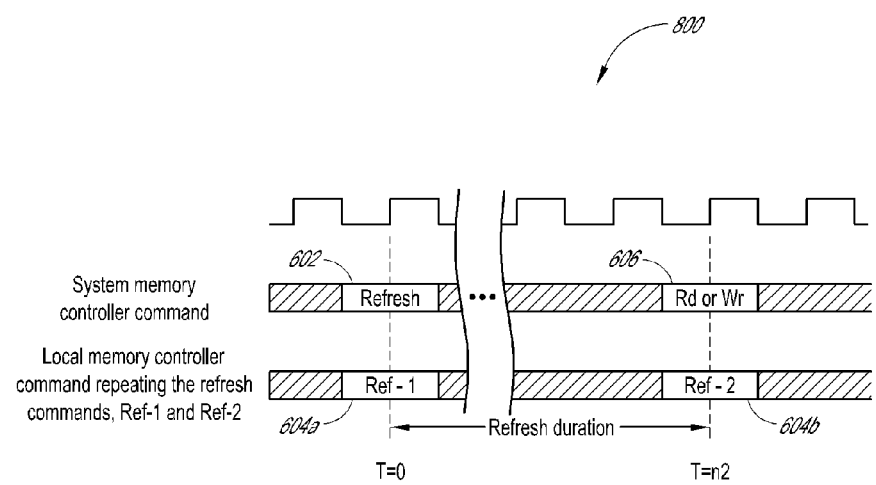
FIG. 6 is a timing diagram of a system wherein a subsequent refresh command from a local memory controller is in conflict (e.g., is coincident) with a command sent from the system memory controller.

FIG. 6 shows a timing diagram 600 of a memory system wherein a logical rank of a memory module is mapped to two or more physical ranks of memory devices on the memory module, and each physical rank receives a separate local chip select signal from the local memory controller of the memory module. The memory subsystem address space corresponding to FIG. 6 is expanded with the decoding of the chip select signals and the one or more address bits from the system memory controller to provide the local chip select signals from the local memory controller. Regardless of the number of physical ranks on the memory module, the system memory controller views the memory module as having the number of logical ranks corresponding to the number of chip select signals from the system memory controller, and expects that the memory devices or logical ranks sharing or corresponding to a particular chip select signal will be refreshed by a single refresh command.

As shown in FIG. 6, refreshing the memory (e.g., DRAM) devices serially or in a staggered fashion may involve the local memory controller on a memory subsystem (e.g., a memory module such as a DIMM) repeating or re-issuing the refresh command multiple times (e.g., issuing a number of refresh commands) equal to at least the size of the third dimension. In the example scenario of FIG. 6, the system memory controller issues a logical rank refresh command 602. In response, the local memory controller can issue a separate refresh command 604*a*, 604*b* for each physical rank associated with the logical rank for which the refresh command 602 was issued. For example, the local memory controller can issue a separate refresh command 604*a*, 604*b* for each set of memory devices physically connected to a separate chip select signal on the memory module. In some cases, however, the system memory controller may execute a command 606 (e.g., a read or write command) as the local memory controller issues one or more of the multiple refresh commands, such as the second refresh command 604*b* in the example scenario. This is because the system memory controller sees only one logical rank and expects that only one refresh command will be issued. When this happens, two or more commands may occupy the command/address bus (e.g., as shown as Time T=n2 in FIG. 6).

In such cases, the presence of multiple commands on the command/address bus at the same time can conflict or cause undesired system behavior (e.g., system failure). The timing diagram of FIG. 6 shows a subsequent refresh command 604*b* from a local memory controller in conflict with a command 606 sent from the system memory controller. In the example system of FIG. 6, the system memory controller does not know about the staged refresh operation being performed by the local memory controller. Thus, the system memory controller issues a command at the same clock cycle that the local memory issues a subsequent refresh command, thereby creating a command conflict. Embodiments described herein advantageously detect such conflicts and delay the issuance of subsequent refresh operations by the local memory controller. For example, the issuance of subsequent physical rank refresh operations can be delayed by the memory module until there is no conflicting command from the system memory controller present on the bus, thereby resolving command conflicts. An example implementation of conflict resolution logic is discussed below with respect to the memory module 1300 of FIG. 13.

In some cases, to sustain system performance, the system memory controller may attempt to access the memory devices of a memory module relatively soon after the memory devices have been refreshed (e.g., as soon as the logical rank refresh duration is over). However, the issuance of physical rank refresh commands generated by the local memory controller can be dynamically delayed if there is a command conflict. As such, the logical rank refresh time may depend on one or more characteristics of the possible command sequences that the system memory controller can issue. For example, as discussed in greater detail herein, the refresh time may depend on the maximum number of consecutive commands that the system memory controller may issue. Thus, for memory modules having more than one physical rank per logical rank and employing a staged refresh scheme, the amount of time it takes to refresh each logical rank may be increased as compared to memory modules having one physical rank per logical rank. This is because the physical rank refreshes are serialized (or staggered) in time. Moreover, as discussed, subsequent physical rank refresh commands often cannot be issued immediately after the preceding physical rank refresh window is complete because of the command conflicts, further increasing the logical rank refresh time.

While the system memory controller may not be aware of exactly when the logical rank refresh is complete, the system memory controller of certain embodiments may be informed as to the maximum amount of time it can take for the memory devices on the memory module or a subset thereof (e.g., a logical rank of memory devices) to refresh in response to a system memory controller logical rank refresh command. It is generally desirable to refresh subsequent physical ranks generally as soon as possible after refreshing preceding physical ranks, while preserving proper operation of the memory system. Embodiments described herein are thus configured to store and/or calculate a refresh time (tRFC) value based at least in part on a maximum amount of time it will take to refresh a logical rank of memory devices. Embodiments described herein may provide the tRFC value to the system memory controller, which can use the value to minimize the delay between logical rank refresh commands, thereby improving efficiency and preserving proper system operation.

In addition, the memory devices may lose their data or otherwise malfunction if they do not receive a refresh command within a certain time period. As such, the physical rank refresh commands generated by the local memory controller cannot be indefinitely delayed. One or more of the memory devices may lose their data if the serialized refresh commands issued by the local memory controller in response to a system memory controller command are delayed beyond a certain amount of time. For example, in some embodiments, each of the memory devices should be refreshed within a predetermined refresh interval in order to preserve the stored data. Embodiments described herein determine a minimum refresh duration or interval. For example, in certain embodiments this minimum refresh duration corresponds to the minimum amount of time after which a system memory controller issues a refresh command for a logical rank until the system memory controller can assume that the memory devices corresponding to the logical rank have been refreshed. In certain embodiments, this minimum refresh duration is short enough to maintain data integrity in the memory devices such that the memory devices do not lose their data or otherwise malfunction. For example, in some embodiments, the minimum refresh duration corresponds to the tRFC value, which can correspond to the maximum amount of time it will take to refresh the memory devices of a logical rank (e.g., in the worst case, such as where it takes the longest to refresh the memory devices). Thus, certain embodiments described herein employ refresh techniques which advantageously sequentializes the refresh activity among multiple ranks that share a common chip select signal, removes the command conflict, minimizes the refresh duration for the performance, and optimizes the refresh period for ensuring the data integrity in the cells of the memory devices.

Figure 7:
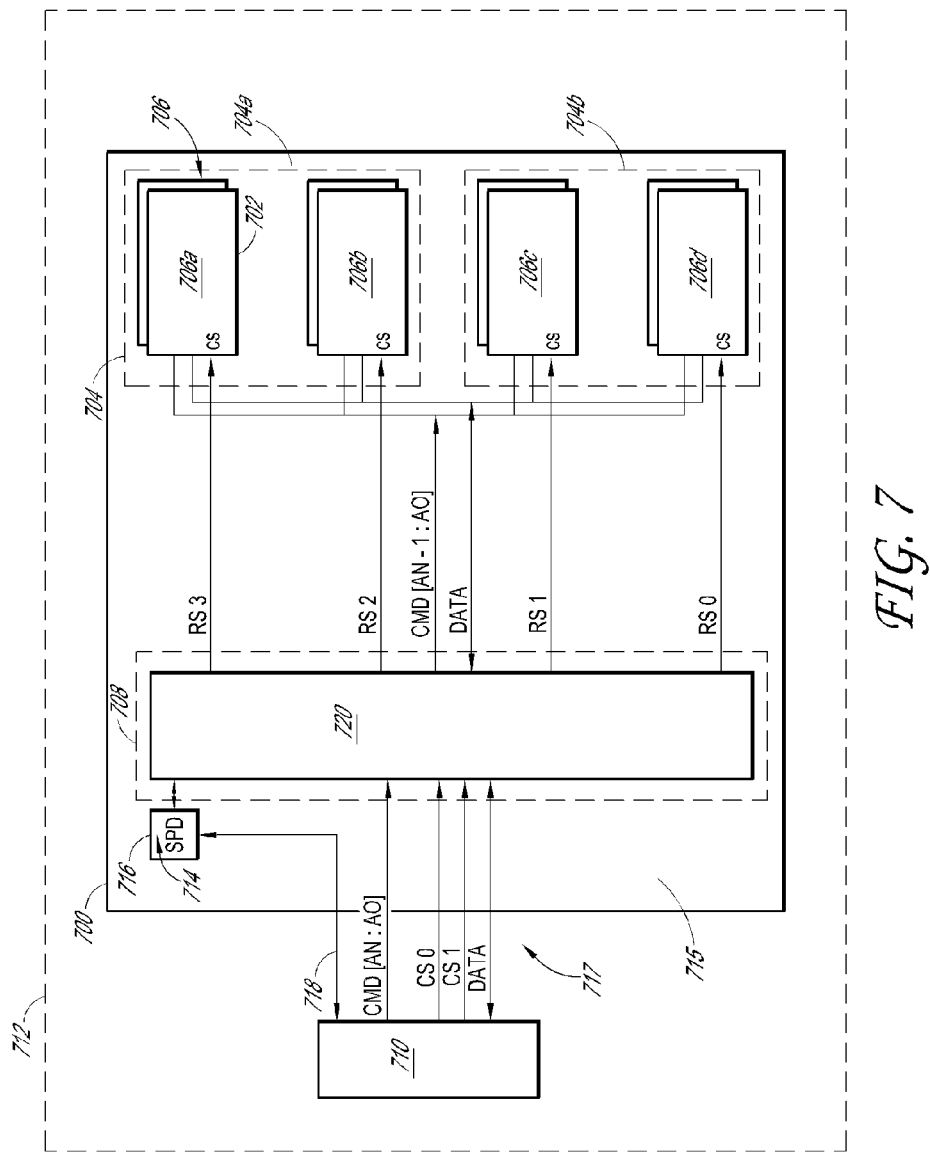
FIG. 7 is a block diagram of a memory module having multiple physical ranks per logical rank and capable of performing a staged refresh operation in accordance with certain embodiments described herein.

FIG. 7 shows a memory module 700 in accordance with certain embodiments described herein. The memory module 700 comprises a plurality of memory devices 702 arranged into one or more logical ranks 704. Each logical rank 704 corresponds to a set of at least two physical ranks 706. In certain embodiments, the memory module 700 further comprises a circuit 708 operatively coupled to the plurality of memory devices 702. The circuit 708 can also be configured to be operatively coupled to a memory controller 710 of a computer system 712 to receive, for a logical rank of the one or more logical ranks 704, a logical rank refresh command generated by the memory controller 710. In certain embodiments, the circuit 708 is configured to initiate, in response to the logical rank refresh command, a first refresh operation for one or more first physical ranks of the set of at least two physical ranks 706 and a second refresh operation for one or more second physical ranks of the set of at least two physical ranks 706, wherein the second refresh operation is initiated after the first refresh operation. The memory module 700 of certain embodiments further comprises a memory location 714 storing a refresh time value (tRFC value) based at least in part on a calculated maximum amount of time for refreshing the logical rank 704, wherein the tRFC value is accessible by the memory controller 710. For example, in certain embodiments, the tRFC value is a value greater than or equal to the maximum amount of time for refreshing the logical rank 704.

The memory module 700 may comprise a printed-circuit board (PCB) 715. In one embodiment, for example, the memory devices 702 are DDR memory devices and the memory module 700 further comprises a printed circuit board 715 configured to be operatively coupled to the memory controller 710. In such an embodiment, the circuit 708 and the plurality of memory devices 702 are mounted on the printed circuit board 715.

In certain embodiments, the memory devices 702 have a total memory capacity of 512-MB, 1-GB, 2-GB, 4-GB, 8-GB, 16-GB, or 32-GB, while other memory capacities are also compatible with certain embodiments described herein. The memory module 700 can be a dual data rate (e.g., DDR, DDR2, DDR3, DDR4) dual in-line memory module (DIMM), for example, coupled to a mother board (not shown) of the computer system 712.

In addition, the memory module 700 having data widths of 4 bytes, 8 bytes, 16 bytes, 32 bytes, or 32 bits, 64 bits, 128 bits, 256 bits, as well as other widths (in bytes or in bits), are compatible with embodiments described herein. In certain embodiments, the PCB 715 has an industry-standard form factor. For example, the PCB 715 can have a low profile (LP) form factor with a height of 30 millimeters and a width of 133.35 millimeters. In certain other embodiments, the PCB 715 has a very high profile (VHP) form factor with a height of 50 millimeters or more. In certain other embodiments, the PCB 715 has a very low profile (VLP) form factor with a height of 18.3 millimeters. Other form factors including, but not limited to, small-outline (SO-DIMM), unbuffered (UDIMM), registered (RDIMM), fully-buffered (FBDIMM), mini-DIMM, mini-RDIMM, VLP mini-DIMM, micro-DIMM, and SRAM DIMM are also compatible with certain embodiments described herein. For example, in other embodiments, certain non-DIMM form factors are possible such as, for example, single in-line memory module (SIMM), multi-media card (MMC), and small computer system interface (SCSI).

In certain preferred embodiments, the memory module 700 is in electrical communication with the host computer system 712. In other embodiments, the memory module 700 may communicate with a host system using some other type of communication, such as, for example, optical communication. Examples of host systems include, but are not limited to, blade servers, 1U servers, personal computers (PCs), etc. The memory module 700 can be in communication with a disk controller of a computer system, for example. The PCB 715 can comprise an interface 717 that is configured to be in electrical communication with the computer system 712. For example, the interface 717 can comprise a plurality of edge connections which fit into a corresponding slot connector of the computer system 712. The interface 717 of certain embodiments provides a conduit for power voltage as well as data, address, and control signals between the memory module 700 and the computer system 712. For example, the interface 717 can comprise a standard 240-pin DDR2 edge connector.

The memory devices 702 of some embodiments comprise two or more dynamic random-access memory (DRAM) elements. Types of DRAM elements compatible with certain embodiments described herein include, but are not limited to, DDR, DDR2, DDR3, DDR4 and synchronous DRAM (SDRAM). The memory devices may comprise other types of memory elements such as static random-access memory (SRAM), or other types of non-volatile or volatile memory elements. In addition, memory devices 702 having bit widths of 4, 8, 16, 32, as well as other bit widths, are compatible with certain embodiments described herein. Memory devices 702 compatible with embodiments described herein have packaging which include, but are not limited to, thin small-outline package (TSOP), ball-grid-array (BGA), fine-pitch BGA (FBGA), micro-BGA (μBGA), mini-BGA (mBGA), and chip-scale packaging (CSP).

The memory module 700 in the illustrated embodiment of FIG. 7 has two logical ranks 704 each corresponding to a set of two physical ranks 706. For example, logical rank 704a corresponds to a set of two physical ranks 706a, 706b, and logical rank 704b corresponds to a set of two physical ranks 706c, 706d. Thus, the ratio of the number of physical ranks 706 to the number of logical ranks 704 is two. In other embodiments, the ratio of physical ranks 706 to logical ranks may be another number, such as 4, 8, 16, or more, for example. Each of the physical ranks 706 comprise at least one memory device 702. The example memory module 700 receives two chip select signals CS0, CS1 from the system memory controller 710, each of which correspond to one of the two logical ranks 704. For example, the system memory controller 710 in one embodiment asserts the CS0 chip select in combination with other commands (e.g., read/write, refresh, etc.) to access one of the logical ranks 704a and the CS1 to access the other logical rank 704b. In addition to the chip select signals CS0, CS1, the system memory controller 710 and the memory module 700 are interconnected by a variety of other signals. For example, without limitation, the system memory controller 710 and memory module 700 can be interconnected by a command and address bus CMD/$A_N$:$A_0$ and a data bus DATA for communicating with the memory module 700.

In certain embodiments, the circuit 708 comprises a field-programmable gate array (FPGA), a programmable-logic device (PLD), an application-specific integrated circuit (ASIC), a custom-designed semiconductor device, a complex programmable logic device (CPLD), or a combination thereof. The circuit 708 can comprise one or more custom devices. In certain embodiments, the circuit 708 comprises various discrete electrical elements, one or more integrated circuits, or a combination thereof. The circuit 708 of certain embodiments generally includes any hardware or software residing on the memory module 700 other than the memory devices 702. For example, the circuit 708 can comprise or be characterized as a local memory controller 720. Additionally, the circuit 708 can include one or more additional modules (not shown), such as one or more buffers or other modules.

The circuit 708 may be configured to translate commands from the system memory controller 710 corresponding to logical ranks 704 to access the appropriate physical ranks 706. For example, in one embodiment, the circuit 708 decodes the chip select signals (CS0, CS1) and the highest order address bit (AN) in order to generate four rank select signals (RS0, RS1, RS2, RS3). Each of the rank select signals are provided to the chip select inputs of the memory devices 702 of the corresponding physical rank 706. As shown, without limitation, circuit 708 can also provide other signals to the memory devices 702, such as a data bus (DATA) and an address and command bus (CMD/$A_{N-1}$:$A_0$) including command signals and the lower order address bits, $A_{N-1}$:$A_0$.

As described, the circuit 708 can also be configured to receive, for a logical rank 704 of the one or more logical ranks 704, a logical rank refresh command generated by the memory controller 710. For example, the circuit 708 may receive logical rank refresh commands (in addition to other types of commands) over the command and address bus CMD/$A_N$:$A_0$. In an example scenario, the circuit 708 receives a refresh command for the logical rank 704a and initiates a refresh of the corresponding set of at least two physical ranks 706a, 706b corresponding to that logical rank 704a. The circuit 708 initiates a first refresh operation for one or more first physical ranks 706a of the set of at least two physical ranks 706a, 706b and a second refresh operation for one or more second physical ranks 706b of the set of at least two physical ranks 706a, 706b. The circuit 708 may initiate the refresh operations by sending a command over the command and address bus CMD/$A_{N-1}$:$A_0$, for example.

As described herein, refreshing the one or more first physical ranks 706a in parallel or concurrently with the one or more second physical ranks 706b can cause undesirable system behavior in certain cases, such as unacceptable levels of refresh current and/or power. As such, the circuit 708 can be configured to initiate a second refresh operation after the first refresh operation. In various embodiments, the second refresh operation can be initiated after the first refresh operation is complete, or at some point during the first refresh operation, such as towards the end of the first refresh operation when the refresh current associated with the first refresh operation is at an acceptably low level. This technique may be described as serialized or staggered refresh, for example.

While the memory module 700 of the illustrated embodiment of FIG. 7 has two physical ranks 706 corresponding to each logical rank 704, other numbers of logical and physical ranks 704, 706, and ratios of physical to logical ranks are possible. In certain embodiments, for example, each logical rank 704 comprises an address space which is mapped into an address space of a set of at least two of the plurality of physical ranks 706. Where there are more than two physical ranks 706 per logical rank 704, the circuit 708 may initiate more than first and second physical rank refresh commands. For example, where there are four physical ranks 706 per logical rank 704, the circuit 708 may initiate a refresh of one or more third physical ranks 706 of the set of physical ranks 706 after the second refresh operation is initiated. After the third refresh operation is initiated, the circuit 708 may complete the refresh of the logical rank by initiating a fourth refresh command of one or more fourth physical ranks 706 of the set of physical ranks 706.

As discussed, the memory location 714 stores a refresh time (tRFC) value based in least in part on a maximum amount of time for refreshing the logical rank 704, wherein the tRFC value is accessible by the memory controller 710. For example, the memory location 714 of some embodiments resides in a serial presence detect (SPD) device 716 operatively coupled to the circuit 708 and accessible by the system memory controller 710. The SPD device 716 can be programmable, DIMM-specific, and/or JEDEC-compatible in various embodiments and may store a variety of other information can provide such information to the system memory controller 710 to allow the computer system 712 to determine various characteristics of the memory module 700. Such characteristics may include memory size, type, timing parameters, serial number, manufacturer and other information about the module 700. The SPD device 716 may include a memory device (e.g., an EEPROM), and the memory location 714 and other information may reside in the memory device. The SPD device 716 and the system memory controller 710 may communicate over a bus 718, allowing the system memory controller to access the information stored on the SPD device 716 (e.g., the tRFC value). In one embodiment, the bus 718 is an SMBus, although other bus types are possible. For example, the system memory controller 710 may, read or otherwise receive the tRFC value from the SPD device 716 and use the tRFC value in scheduling commands to the memory module 700. The tRFC value may thereby allow the system memory controller 710 to maintain proper operation of the system and/or provide improved performance.

In certain embodiments, the circuit 708 is configured to cause the tRFC value to be stored in the SPD device 716. For example, the circuit 708 can be configured to calculate the tRFC value and communicate the tRFC value to the SPD device 716 for storage and later access by the system memory controller 710. The circuit 708 of certain embodiments is configured to calculate the tRFC value so as to improve operational efficiency, as will now be described.

Figure 8:
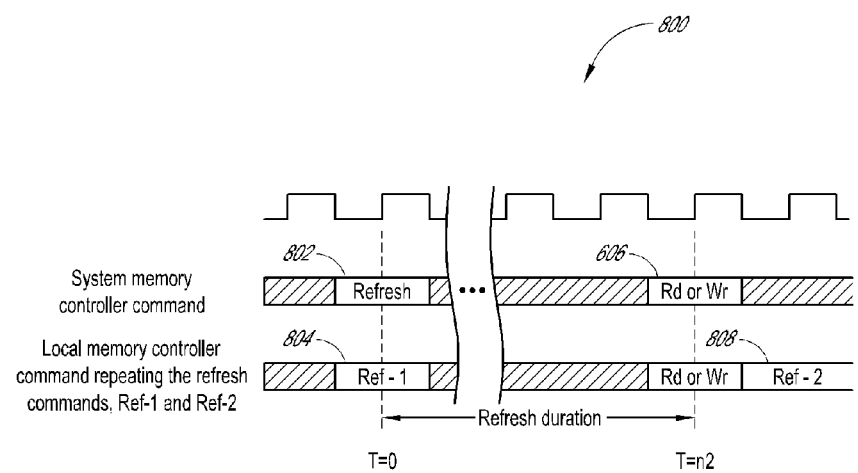
FIG. 8 is a timing diagram of an example system in accordance with certain embodiments described herein wherein a local memory controller detects a potential command conflict situation (e.g., as shown in FIG. 6) and reschedules a subsequent refresh command.

Calculation of the tRFC value can depend on a number of factors, including the amount of time that the circuit 708 waits before sending subsequent physical rank refresh commands. Such delay can depend at least in part on command conflict situations. FIG. 8 is a timing diagram 800 of an example system wherein a circuit 708 (e.g., local memory controller 720) of a memory module 700 receives a logical rank refresh command 802 and issues a first physical rank refresh command 804 in response. However, the circuit 708 detects a potential command conflict situation, e.g., due to a read or write command 806 issued by the system memory controller. Thus, the circuit 708 delays (e.g., stages or reschedules) a subsequent physical rank refresh command 808 in accordance with certain embodiments described herein. The example system and circuit may by the memory module 700 and circuit 708 of FIG. 7. In the example case of FIG. 8, as in the configuration of FIG. 6, the system memory controller 710 does not know about the staged refresh operation conducted by the circuit 708 (e.g., local memory controller 720). However, in FIG. 8, the circuit 708 (e.g., local memory controller 720) has rescheduled the second refresh command, thereby avoiding the potential command conflict.

As discussed, in certain embodiments, where the refresh commands are executed in series or otherwise in a staged fashion, the circuit 708 (e.g., local memory controller 720) advantageously issues a logical rank refresh command once for each physical rank 706 corresponding to the respective logical rank 704 on the memory module 700 (e.g., twice for two physical ranks) and delays the re-issuance of the refresh command (e.g., the issuance of the subsequent refresh commands), as shown in FIG. 8. For example, when the system memory controller 710 issues a command at the same cycle for which the circuit 708 (e.g., local memory controller) has scheduled to re-issue the refresh command, the circuit 708 (e.g., local memory controller) may delay the re-issuance of the refresh command (e.g., the issuance of a subsequent refresh command) so that it does not conflict with the command from the system memory controller 710.

However, in some cases, the number of delay cycles that the circuit 708 (e.g., local memory controller) inserts prior to issuing a subsequent refresh command may depend on the maximum number of consecutive commands that can be issued by the system memory controller 710. As such, the total refresh duration for a logical rank of the memory system may be difficult to determine or predict in advance.

Figure 9:
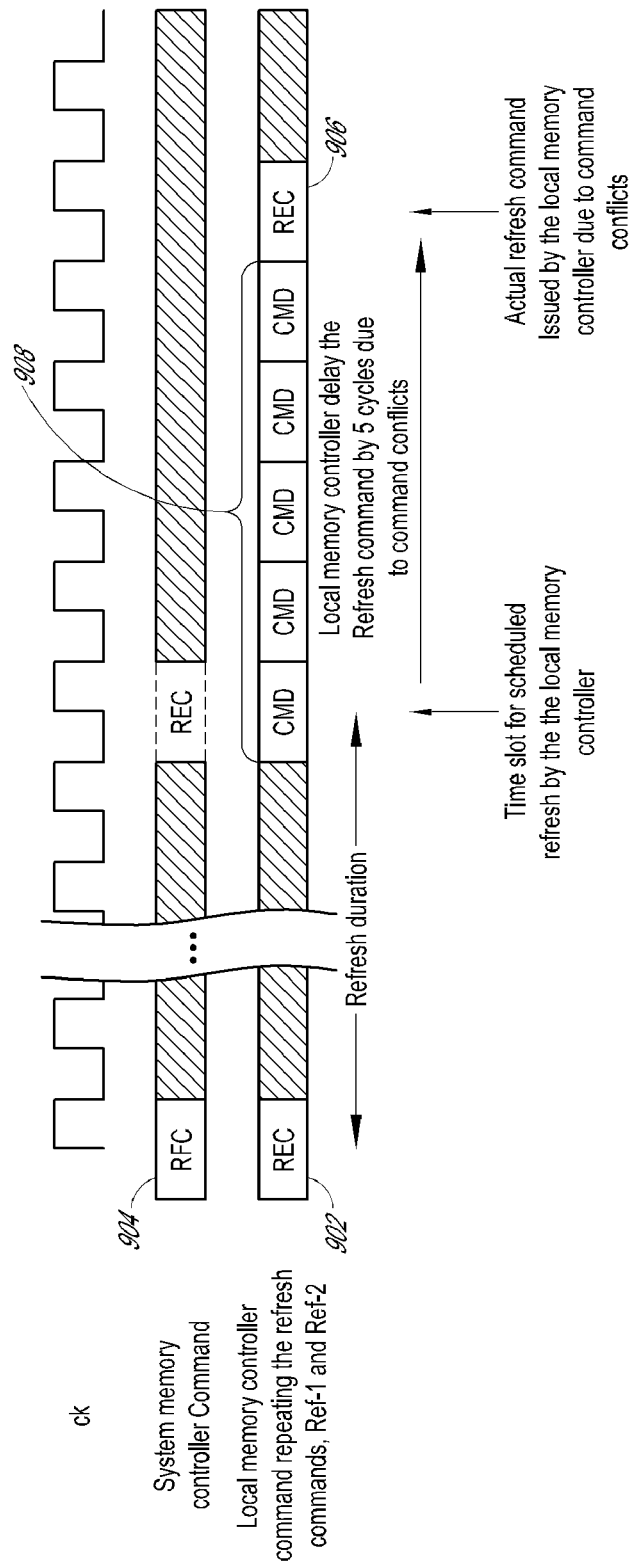
FIG. 9 is a timing diagram of an example system wherein a local memory controller delays a refresh command due to potential scheduling conflicts in accordance with certain embodiments described herein.

FIG. 9 is a timing diagram 900 of an example system wherein a circuit 708 (e.g., local memory controller) of a memory module 700 delays a refresh command due to a potential scheduling conflict in accordance with certain embodiments described herein. For example, the example system may be the memory module 700 of FIG. 7 and include a circuit (e.g., local memory controller) such as the circuit 708 of FIG. 7, or the memory module 1300 and local memory controller 1305 of FIG. 13, discussed below. In certain embodiments, the circuit 708 issues a physical rank refresh command 902 in response to a logical rank refresh command 904 issued by the system memory control 710, and delays the issuance of a subsequent physical rank refresh command 906 for a number of clock cycles that is dependent on one or more operating parameters or specifications of the system. For example, if the system memory controller 712 can assert a maximum of five, back-to-back sequential commands 908 to an active rank on the memory module 700, the circuit 708 can be configured to delay the issuance of the subsequent physical rank refresh command 906 for five cycles, thereby avoiding a command conflict.

Figure 10:
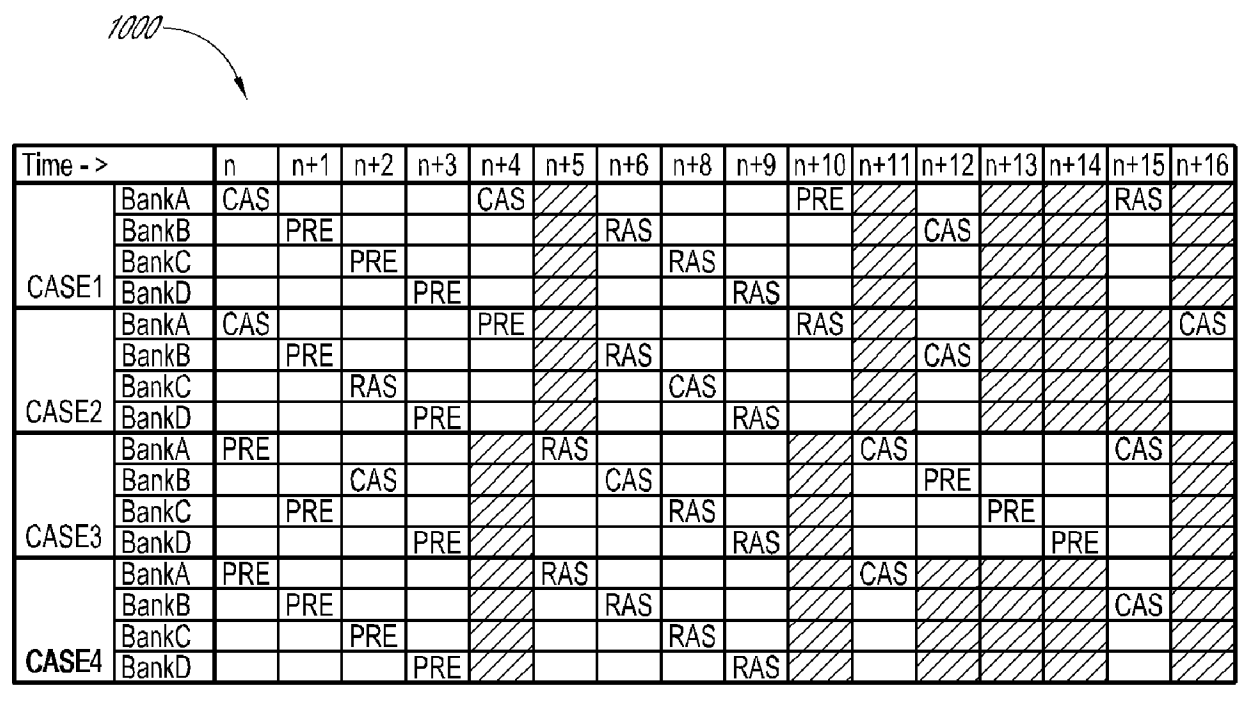

FIG. 10 is a table 1000 showing example command sequences of an example system and including an example scenario illustrating the maximum number of consecutive commands that a system memory controller 710 can issue to a logical memory rank 704 in accordance with certain embodiments described herein. In general, the shaded time slots of FIG. 10 correspond to time slots in which a command from the system memory controller 710 does not occupy the address and command bus and the un-shaded time slots represent time slots in which a command from the system memory controller 710 does occupy the bus. The example table 1000 of FIG. 10 corresponds to a memory system where the actual number of physical ranks 706 on the memory module 700 is twice the number of logical ranks 704 from the viewpoint of the system memory controller 710.

In addition, the example table 1000 of FIG. 10 corresponds to example operation of a memory module 700 operating according the Four-bank Activation Window ("tFAW") parameter specified in the DDR3 DRAM interface specification. In general, the tFAW parameter defines a limit on the number of simultaneously active banks allowable for a DRAM device within a certain timing window for the purpose of limiting the peak current requirement of a DRAM device. In certain embodiments, the tFAW parameter may also define or be characterized as the Time for Four Active Words (e.g., Banks). For example, the tFAW parameter may represent a sliding window of time during which no more than four row activation commands to the same device may appear. The tFAW parameter may limit the peak and/or maximum current by defining a rolling timing window within which a maximum of four banks can be activated. The tFAW parameter generally limits the peak current of a DRAM. The tFAW may be defined for four simultaneously active banks.

Specifically, the table 1000 of FIG. 10 corresponds to an example memory module 700 having four physical ranks 706 (e.g., four sets of memory devices 702 connected to separate chip select signals) and two logical ranks 704 from the point of view of the system memory controller 710. When the system memory controller 710 issues a refresh command, the system memory controller 710 assumes that only one logical rank 704 on the memory module 700 is active until the completion of the refresh command. As such, there is a limited set of back-to-back command combinations that the system memory controller 710 can issue and a corresponding limited number of clock cycles that the system memory controller 710 can occupy the address and command bus over a given period of time. As shown, in the example scenario of FIG. 10 the maximum number of clock cycles that the system memory controller 710 will continuously occupy the address and command bus is five clock cycles. Thus, the command and address bus will be available to the circuit 708 (e.g., local memory controller 720) to issue a subsequent refresh command within six clock cycles in the worst case.

In certain embodiments, circuit 708 is configured to calculate the tRFC value in response to at least a maximum amount of time it takes to refresh a physical rank 706, the number of physical ranks 706 per logical rank 704, and a maximum number of continuous clock cycles that commands generated by the memory controller 710 can occupy the command bus. In certain embodiments, for example, the circuit 708 is configured to calculate the tRFC value according to the equation:

$$tRFC=(PR\_refresh\_time*num\_PR\_per\_LR)+ (bus\_wait*clk\_per), \quad (eq.\ 1)$$

where PR_refresh_time is an amount of time it takes to refresh a physical rank 706, num_PR_per_LR is the number of physical ranks corresponding to a logical rank, bus_wait is a maximum number of continuous clock cycles that commands generated by the memory controller 710 can occupy the command bus, and clock_per is a system clock period. In certain embodiments, the bus_wait value may be the maximum time between physical rank 706 refreshes due to bus utilization by the system memory controller 710. Thus, for the example scenario of FIG. 10, a maximum refresh time ("tRFC") for completing a refresh of a logical rank 704 can be calculated as follows:

$$tRFC=(PR\_refresh\_time \times 2)+(5 \times clk\_per), \quad (eq.\ 2)$$

In certain embodiments, the circuit 708 is configured to calculate the tRFC value at least in part based on a four activate window (tFAW) value. For example, the circuit 708 can be configured to calculate the tRFC value according to the equation:

$$tRFC \geq (PR\_refresh\_time*num\_PR\_per\_LR)+ (tFAW-num\_open\_slots)*clk\_per \quad (eq.\ 3)$$

where PR_refresh_time is an amount of time it takes to refresh a physical rank 706, num_PR_per_LR is the number of physical ranks corresponding to a logical rank 704, tFAW is the four activate window value, and num_open_slots is a minimum number of open slots within the tFAW in which there is not a memory controller 710 command on the command bus.

Figure 11:
FIG. 11 is an example table and corresponding formula used by an example system for computing the refresh time used for refreshing a logical rank (e.g., tRFC) in accordance with certain embodiments described herein.

FIG. 11 shows a table 1100 and corresponding formula used by an example system (e.g., memory module 700) for computing the refresh time needed for refreshing a logical rank 704 in accordance with certain embodiments described herein.

For example, the table 1100 and corresponding formulas of FIG. 11 may be used to determine a maximum tRFC for a logical rank including generally any size memory (e.g., DRAM) device 702. The table of FIG. 11 shows the minimum number of open time slots on the address and command bus (e.g., CMD/$A_{N-1}$:$A_0$) within the tFAW duration for various configurations. The minimum number of open time slots may be calculated according to the equation:

$$num\_open\_time\_slots=tFAW-\#ofACT-\#ofPRE-\#of-CAS, \quad (eq.\ 4)$$

where #ofACT is a number of Page Open or RAS commands in a given tFAW window, #ofPRE is a number of Precharge or Page Close commands in a given tFAW window, and #ofCAS is a number of Column Access or Read/Write commands in a given tFAW window. For example, as shown in FIG. 11, for a memory system (e.g., memory module 700) operating at 1333 MHz there will be 6 open time slots in which there is not a system memory controller command on the address and command bus within a 20 clock cycle window (e.g., the maximum wait_time). Thus, in certain embodiments, such as where there are two physical ranks 706 per logical rank 704 and where the memory system (e.g., memory module 700) is operating at 1333 MHz or 1067 MHz, the maximum refresh time needed for a logical rank ("tRFC") can be calculated and/or programmed into the SPD 716 as follows:

$$tRFC \geq (PR\_refresh\_time*2)+(20*clk\_per). \quad (eq.\ 5)$$

As discussed, if the system memory controller 710 waits for at least tRFC after issuing a logical rank refresh command, then the memory module 700 will generally have sufficient time to refresh the memory devices 702 of the logical rank 704 before any subsequent access of the memory devices 702 by the system memory controller 710.

In accordance with certain embodiments described herein, the local memory controller 720 of a memory system or subsystem (e.g., a memory module 700) incorporating a rank-hiding technique or having an expanded memory space can issue refresh commands serially to multiple physical ranks 706. For example, the circuit 708 (e.g., local memory controller) may sequentially issue refresh commands to each physical rank 706 in response to receiving a refresh command from the system memory controller 710 for a logical rank 704. This technique may be referred to as "serialized refresh," "refresh stagger," "staggered refresh," and the refresh commands may be referred to as "serialized," "sequentialized," or "staggered" throughout this disclosure. In addition, the concept of issuing one refresh command for a logical rank comprising multiple physical ranks may be referred to as "broadcast refresh."

One approach recently suggested for dealing with refresh conflicts has been to use a timer including a counter (e.g., a programmable counter) which counts the refresh period used, including jitter, and implementing a "round-robin" scheduling algorithm using the timer. The refresh jitter may be the amount of time during a logical rank refresh where the local memory controller (or a buffer of the memory system) is attempting to put a refresh command on the bus (e.g., for a physical rank), but cannot do so because of other commands (e.g., due to one or more command conflicts). According to such an approach, upon receiving a refresh command for a logical rank, a refresh cycle begins and the local memory controller begins to refresh the physical ranks serially. If the counter has not expired prior to refreshing the last physical rank, each of the physical ranks in the logical rank will be refreshed in the current refresh cycle. However, if the counter expires (e.g., reaches zero), the local memory controller will not initiate a refresh for any physical ranks which have not yet been refreshed, and those physical ranks will not be refreshed in the current refresh cycle. This process may be described as "dropping" refresh commands for the physical ranks which are not refreshed on a given logical rank refresh cycle. Upon receiving a subsequent refresh command from the system memory controller for the logical rank, the local memory controller will begin a subsequent refresh cycle in which it first refreshes the physical ranks which were not refreshed in the previous refresh cycle. Depending on when the timer expires, one or more of the physical ranks which were refreshed in the previous refresh cycle may be refreshed in the subsequent refresh cycle as well. The counter may be programmed such that the time corresponding to the expiration of the counter is the maximum refresh time (tRFC), or some value slightly larger than tRFC, or some other value.

One potential problem with the round-robin approach may occur when a refresh is initiated for a physical rank because the counter has not expired, but where tRFC expires before the refresh is completed for that rank. For example, this situation may occur where the counter has not expired but is at some relatively small value when the refresh is initiated for a physical rank. For example, the counter may be at a value corresponding to an amount of time smaller than the amount of time it takes to refresh a physical rank. In such a situation, tRFC may expire while the physical rank is being refreshed and system failure or other malfunction may occur. For example, the system memory controller may attempt to access a portion of a physical rank while that portion is being refreshed. Also, a subsequent physical rank refresh may be executed only where the counter is at a value corresponding to an amount of time sufficient to complete the physical rank refresh before expiration of the counter.

Another problem with the round-robin approach is that under certain circumstances (e.g., for memory modules having particular rank configurations, memory device operating frequencies, etc., or combinations thereof), one or more memory (e.g., DRAM) devices of the memory system (e.g., of a memory module) may not be refreshed within the minimum refresh interval, and the stored data may therefore be lost. For example, as discussed, a refresh for a particular physical memory rank may be dropped or not executed according to a round-robin scheduling technique. The refresh for that physical memory rank may therefore not be executed until a second logical rank refresh cycle is initiated when a second refresh command is received from the system memory controller for the corresponding logical rank. Moreover, in some cases, the refresh for that physical rank may also be dropped on the second refresh cycle and/or one or more later refresh cycles. For some configurations, the time between memory refreshes for the memory (e.g., DRAM) devices may be increased by as much as one-third or more as compared to a system not incorporating a round-robin technique. Example systems where the memory devices may not be refreshed within the minimum refresh interval according to a round-robin approach are 32 GB dual-inline memory modules running at 1333 MHz or greater and having two logical ranks mapped to eight physical ranks (e.g., where each logical rank mapped to four physical ranks). Given such problems, the maximum time between refresh operations for a given memory location in a system using a round-robin approach can be increased by up to ⅓ as compared to a non-round-robin approach.

Grouped Serialized Refresh

In certain circumstances (e.g., for memory modules having particular rank configurations, memory device operating frequencies, etc., or combinations thereof), the serialized refresh technique may be modified. For example, the serialized refresh technique may be modified to ensure that the time it takes a logical rank to refresh satisfies the maximum refresh time (tRFC) and/or to ensure that the minimum refresh interval is satisfied such that data is not lost.

For example, in certain embodiments, a plurality of physical ranks corresponding to one logical rank are grouped into a plurality of groups. The serialized refresh may be executed such that the physical ranks of each group are refreshed simultaneously or substantially simultaneously with the other physical ranks of the corresponding group. For example, the refresh commands for the physical ranks of each group are initiated or executed concurrently, substantially concurrently, in parallel, substantially in parallel, or are initiated at substantially the same time.

In some embodiments, each logical rank is mapped to four physical ranks and the serialized refresh is executed such that two of the physical ranks comprising a first group are refreshed simultaneously with one another and the other two physical ranks comprising a second group are refreshed simultaneously with one another, but following the refresh command of the first group. This technique is referred to herein as "grouped serialized refresh," "grouped staggered refresh," or "grouped staged refresh," for example. In certain embodiments, the methods, calculations and formulas described herein, such as the calculations of maximum refresh time (tRFC) described with respect to FIG. 10 and FIG. 11 described herein are generally compatible with grouped serialized-refresh.

In certain embodiments, grouped serialized refresh may advantageously be used to maintain an acceptable peak current and/or power demand while also maintaining an acceptable maximum refresh time (tRFC) and/or minimum refresh interval. In an example configuration, each logical rank of a memory module is mapped to four physical ranks which are grouped into a first group and a second group. The maximum acceptable peak refresh current for such a configuration can be 200 mA and the peak refresh current for each physical rank can be 90 mA. The peak refresh current for each of the first and second groups may therefore be 180 mA (90 mA*2), which is within the 200 mA peak refresh current limit. In certain example embodiments, since the refresh current used for a DRAM having a density four times greater than a lower density DRAM can be more that twice that of the refresh current used for the lower density DRAM (e.g., the refresh current used for a 4 Gb DRAM can be greater than twice the refresh current used for a 1 Gb-DRAM), four physical ranks can be grouped into two groups, or eight physical ranks can be grouped into two or four groups, etc. Thus, in certain embodiments, this grouping method can reduce the refresh time and allow for the refresh peak current requirement to be met.

Figure 12:
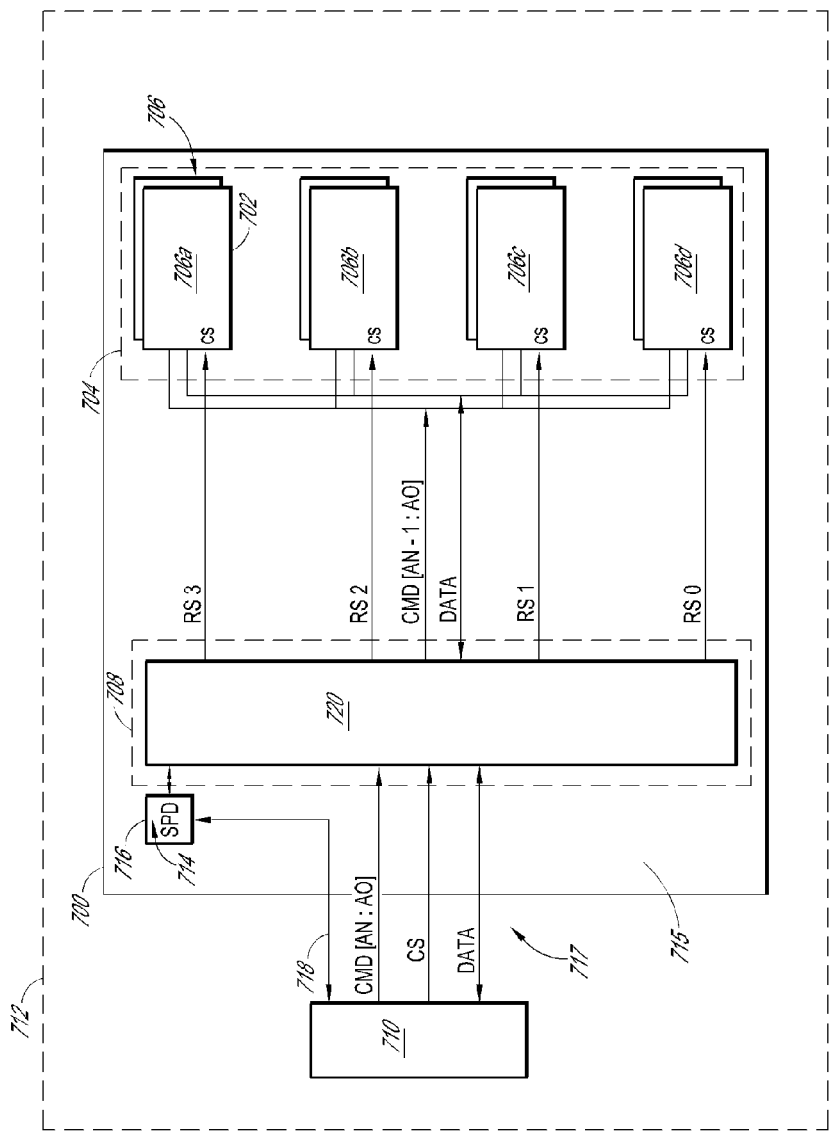
FIG. 12 is a block diagram of another example memory module having more than one physical rank per logical rank and capable of performing a grouped serialized refresh operation in accordance with certain embodiments described herein.

A grouped serialized (or staggered) refresh technique in accordance with embodiments described herein may be used advantageously avoid the problems of the round-robin refreshing technique. FIG. 12 shows a memory module 701 having a ratio of physical ranks 706 to logical ranks 704 of four, and which can be configured to implement a grouped serialized (or staggered) refresh command in accordance with embodiments described herein.

The memory module 701 is similar to the memory module 700 of FIG. 7, and comprises a plurality of memory devices 702 arranged into one or more logical ranks 704. Each logical rank 704 corresponds to a set of at least two physical ranks 706. In certain embodiments, the memory module 700 further comprises a circuit 708 operatively coupled to the plurality of memory devices 702. The circuit 708 can also be configured to be operatively coupled to a memory controller 710 of a computer system 712 to receive, for a logical rank of the one or more logical ranks 704, a logical rank refresh command generated by the memory controller 710. In certain embodiments, the circuit 708 is configured to initiate, in response to the logical rank refresh command, a first refresh operation for one or more first physical ranks of the set of at least two physical ranks 706 and a second refresh operation for one or more second physical ranks of the set of at least two physical ranks 706, wherein the second refresh operation is initiated after the first refresh operation. The memory module 700 of certain embodiments further comprises a memory location 714 storing a refresh time (tRFC) value based at least in part on a calculated maximum amount of time for refreshing the logical rank, wherein the tRFC value is accessible by the memory controller 710.

In certain embodiments, the one or more first physical ranks comprise at least two physical ranks 706 and the one or more second physical ranks comprise at least two physical ranks 706. For example, in one embodiment, the one or more first physical ranks 706 comprise the physical ranks 706*a*, 706*b*, while the one or more second physical ranks comprise the remaining physical ranks 706*c*, 706*d*. Thus, the first refresh operation refreshes the two physical ranks 706*a*, 706*b*, and, afterwards, the second refresh operation refreshes the other two physical ranks 706*c*, 706*d*.

In general, in certain embodiments, the one or more first physical ranks 706 can comprise N physical ranks configured to be refreshed concurrently with one another and the one or more second physical ranks 706 comprise N physical ranks configured to be refreshed concurrently with one another, where N is a number greater than or equal to two. For example, N can be 2, 3, 4, 8, 16 or more physical ranks 706 in certain embodiments. Because multiple groups of physical ranks 706 are refreshed serially (or in a staggered fashion), this technique can be referred to as a grouped serialized (or staggered) refresh. Moreover, in certain other embodiments, more than two groups of N physical ranks 706 can be refreshed in a serialized (or staggered) manner. For example, in one embodiment, a third group of N physical ranks 706 is refreshed after the one or more second physical ranks 706. In some embodiments, N may correspond to a number of physical ranks that can be refreshed concurrently while maintaining proper system operation (e.g., maintaining peak refresh current and/or power at an acceptable level).

In certain embodiments, such as embodiments employing grouped serialized refresh, the circuit 708 is configured to calculate the tRFC value according to the equation:

$$tRFC = \left(PR\_refresh\_time * \frac{num\_PR\_per\_LR}{N}\right) + \left(\left\lfloor \frac{num\_PR\_per\_LR - 1}{N} \right\rfloor * refresh\_wait\_time\right), \quad (eq.\ 6)$$

where PR_refresh_time is an amount of time it takes to refresh a physical rank 706, num_PR_per_LR is the number of physical ranks corresponding to a logical rank 704, and refresh_wait_time is an amount of delay inserted after each physical rank refresh. In various embodiments, refresh_wait_time can corresponds to an amount time corresponding to 20 clock cycles, 6 clock cycles, the tFAW duration, the number of open slots in a tFAW window subtracted from the tFAW duration, or some other value.

Example Local Memory Controller

Figure 13:
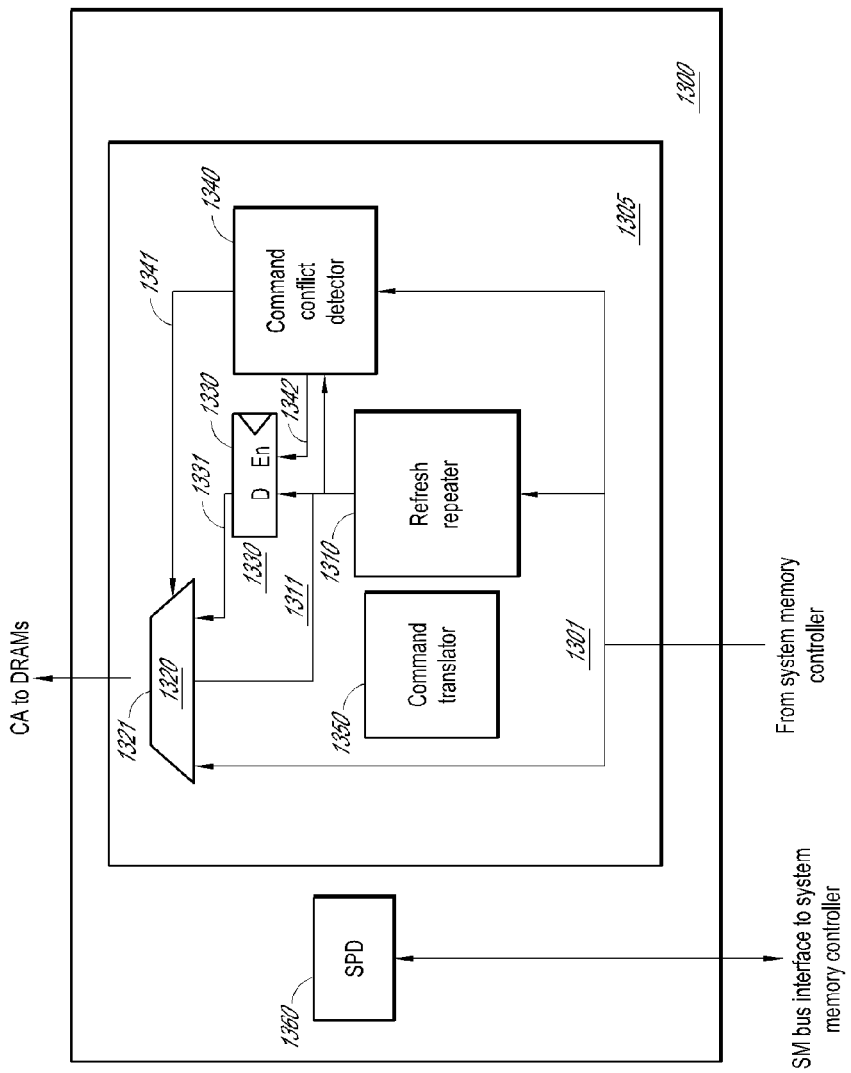
FIG. 13 is a block diagram of an example local memory controller in accordance with certain embodiments described herein.

FIG. 13 is a block diagram of another example memory module 1300 comprising a local memory controller 1305 in accordance with certain embodiments described herein. For example, the memory module 1300 and the local memory controller 1305 may be similar to or may be any of those described herein, such as the memory module 700 and local memory controller 720 of FIG. 7 or the memory module 701 and local memory controller 720 of FIG. 12. In certain embodiments, the local memory controller 1305 of FIG. 13 is configured to resolve potential command conflicts such as command conflicts due to staged refresh commands described herein. For example, the local memory controller 1305 of certain embodiments is configured to serially execute multiple refresh commands (e.g., one for each set of memory devices of a physical rank corresponding to a separate local chip select signal) in response receiving a single refresh command from the system memory controller (e.g., a refresh command for a logical rank) as described herein. For example, the local memory controller 1305 can comprise circuitry implementing logic configured to delay (e.g., hold back) one or more refresh commands issued by the local memory controller when a potential command conflict scenario occurs (e.g., such as in the scenarios described above with respect to FIGS. 6, 8 and 9). In certain embodiments, for example, the local memory controller 1305 may be configured to resolve a potential command conflict in the manner shown in FIG. 8 or 9.

In certain embodiments, the command conflict detector 1340 monitors (e.g., continually) the locally generated refresh signal 1311 signal generated by the refresh repeater 1310 and the incoming command signal 1301 from the system memory controller. For example, refresh commands may be sent from the system memory controller to the local memory controller 1305 via the command signal 1301. In certain embodiments the refresh repeater 1310 of certain embodiments is configured to receive a refresh command signal from the system memory controller and output a version of the refresh command signal. For example, the refresh repeater 1310 may output one or more time delayed versions of the refresh command signal in succession. In one embodiment, the memory module 1300 includes one or more logical ranks which are each mapped to two physical ranks. In such an embodiment, when the local memory controller 1305 receives a refresh command associated with a logical rank from the system memory controller, a first, non-time delayed version of the refresh command is sent to one or more of the physical ranks. The refresh repeater 1310 generates a time delayed version of the refresh command to send to one or more of the physical ranks after the first, non-delayed version of the refresh command is sent. In another embodiment, the memory module 1300 includes one or more logical ranks which are each mapped to four physical ranks. In such an embodiment, when the local memory controller 1305 receives a refresh command associated with a logical rank from the system memory controller, a first, non-time delayed version of the refresh command is sent to one or more of the physical ranks. The refresh repeater 1310 generates three time delayed versions of the refresh command to send in succession to one or more of the physical ranks after the first, non-delayed version of the refresh command is sent. In certain embodiments, the first, non-delayed version of the refresh command is sent by forwarding the command signal 1301 directly to the one or more physical ranks. In other embodiments, the first, non-delayed version of the refresh command may be sent in some other way (e.g., the refresh repeater 1310 may generate or forward a non-time delayed version of the refresh command). Thus, the refresh repeater 1310 of certain embodiments does not merely replicate any refresh signal it receives; rather it replicates with timing delays. The command conflict detector 1340 may be further configured to generate at least two control signals. A first control signal may be the register enable signal 1342, which enables storing a refresh command generated by the local memory controller 1300, or the status thereof, to the register 1330. In certain embodiments, the first control signal can support the sequential execution of refresh commands from the system memory controller. The second control signal may be the signal 1341 which is configured to control or direct the command select logic 1320. The command select logic 1320 outputs one of 3 command signals: 1) signal 1301 directly from the system memory controller; 2) signal 1311 from the refresh repeater 1310; and 3) the output 1331 of the register 1340. For example, the command select logic 1320 may comprise a three to one multiplexor in certain embodiments which outputs one of the signals 1301, 1311, 1331 in response to the value of the control signal 1342.

In certain embodiments, the command conflict detector 1340 deasserts the register enable signal 1342 in response to one or more potential command conflicts. For example, the system memory controller may issue multiple (e.g., five) back-to-back cycle commands. In such a scenario, the command conflict detector 1340 may delay or hold off assertion of the enable signal for a number of cycles corresponding to the number of commands (e.g., five) as shown in FIG. 9. In addition, as described, the control signal 1341 allows the command select logic 1320 to route the incoming command signals 1301 from the system memory controller to the memory devices. The command select logic 1320 routes the output 1331 of the register 1330 when there is no command from the system memory controller and there is a pending refresh command stored in the register 1330. The command select logic routes the output signal 1311 from the refresh repeater 1310 in other cases (e.g., upon receiving successive refresh commands from the local memory controller).

The local memory controller 1305 comprises a configurable local memory controller configured to receive commands from a system memory controller (not shown) and perform a translation of one or more commands from the system memory controller for controlling the memory module. The memory module 1300 further includes an automatic delay adjusting refresh repeater 1310 configured to receive a refresh command from the system memory controller and to refresh one or more memory devices on the memory module by issuing multiple serial refresh commands. The number of serial refresh commands may correspond to or match the ratio of actual or physical ranks on the memory module to the number of logical ranks seen from the point of view of the system memory controller, for example. The memory module 1300 may further include a configurable command translator 1350 configured to translate the address from the logical address space from the point of view of the system memory controller to the physical address space of the memory devices on the memory module 1300. The command translator 1350 may be further configured to schedule the issuance of commands to the memory devices based on commands received from the system memory controller. The memory module 1300 further includes a command conflict detector 1340 as described herein for detecting and resolving command conflicts between the system memory controller and the local memory controller 1305. The memory module 1300 may further include a refresh command sampler 1330 for sampling and holding one or more refresh commands generated by the local memory controller 1305.

Referring again to the timing diagram of FIG. 9, the local memory controller in one example scenario deasserts the register enable signal for a number of clock cycles that is dependent on one or more operating parameters or specifications of the system. For example, if the system memory controller can assert five, back-to-back sequential commands to an active rank on the memory module, the command conflict detector 840 of an embodiment deasserts the register enable signal for five cycles.

Figure 14:
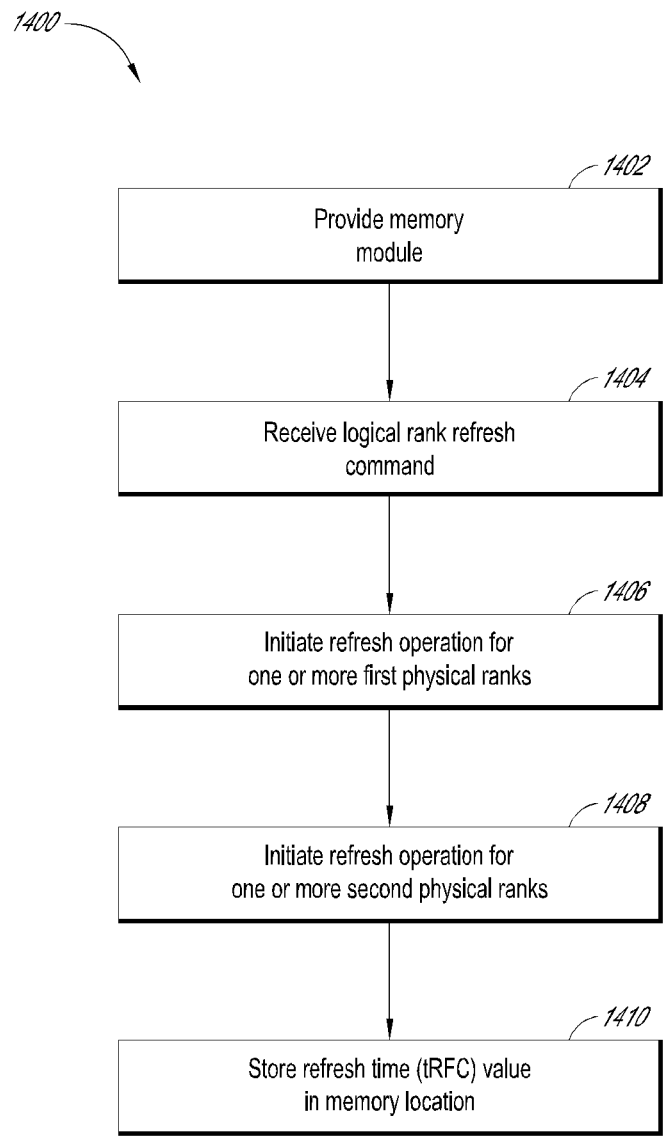
FIGS. 14 and 15 are flow diagrams of methods of using a memory module in accordance with certain embodiments described herein.

FIG. 14 shows a method 1400 of using a memory module 700 in accordance with certain embodiments described herein. At block 1402, the method 1400 can include providing a memory module 700 comprising a plurality of memory devices 702 arranged into one or more logical ranks 704, each logical rank 704 corresponding to a set of at least two physical ranks 706. In certain embodiments, the method 1400 can include receiving a command to refresh a logical rank 704 of the one or more logical ranks 704 at block 1404.

At block 1406, the method 1400 of certain embodiments further comprises initiating a refresh operation for one or more first physical ranks 706 of the set of physical ranks 706 corresponding to the logical rank 704 in response to the command. At block 1408, the method may comprise initiating a refresh operation for one or more second physical ranks 706 of the set of physical ranks 706 corresponding to the logical rank 704 in response to the command.

At block 1410, the method can also include storing a refresh time (tRFC) value in a memory location 714 of the memory module 700. The tRFC value may be based at least in part on a calculated maximum amount of time for refreshing the logical rank 704, for example, and/or may be accessible by the memory controller 710.

In certain embodiments, the tRFC value is calculated in response to at least a maximum amount of time it takes to refresh a physical rank, the number of physical ranks per logical rank, and a maximum number of continuous clock cycles that commands generated by the memory controller 710 can occupy the command bus. For example, the tRFC value can be calculated according to the equation:

$$tRFC = (PR\_refresh\_time * num\_PR\_per\_LR) + (bus\_wait * clock\_per) \qquad \text{(eq. 7)}$$

where PR_refresh_time is an amount of time it takes to refresh a physical rank 706, num_PR_per_LR is the number of physical ranks 706 corresponding to a logical rank 704, bus_wait is a maximum number of continuous clock cycles that commands generated by the memory controller 710 can occupy the command bus, and clock_per is a system clock period.

Additionally, in certain embodiments, the tRFC value may calculated at least in part based on a four activate window (tFAW) value. For example, the tRFC value is calculated according to the equation:

$$tRFC \geq (PR\_refresh\_time * num\_PR\_per\_LR) + (tFAW - num\_open\_slots) \qquad \text{(eq 8)}$$

where PR_refresh_time is an amount of time it takes to refresh a physical rank 706, num_PR_per_LR is the number of physical ranks 706 corresponding to a logical rank 704, tFAW is the four activate window value, and num_open_slots is a minimum number of open slots within the tFAW in which there is not a memory controller 710 command on the command bus.

In some embodiments, the one or more first physical ranks 706 comprise N physical ranks configured to be refreshed concurrently with one another and wherein the one or more second physical ranks 706 comprise N physical ranks configured to be refreshed concurrently with one another, where N is a number greater than or equal to two.

In yet further embodiments, the tRFC value is calculated according to the equation:

$$tRFC = \left(PR\_refresh\_time * \frac{num\_PR\_per\_LR}{N}\right) + \left(\left\lceil \frac{num\_PR\_per\_LR - 1}{N} \right\rceil * refresh\_wait\_time\right), \qquad \text{(eq. 9)}$$

where PR_refresh_time is an amount of time it takes to refresh a physical rank 706, num_PR_per_LR is the number of physical ranks 706 corresponding to a logical rank 704, and refresh_wait_time is an amount of delay inserted after each physical rank refresh.

The method 1400 can further comprise calculating the tRFC value prior to storing the value in the memory location 712 of the memory module 700, and the calculating step can be performed by a circuit 708 mounted on the memory module 700.

Figure 15:
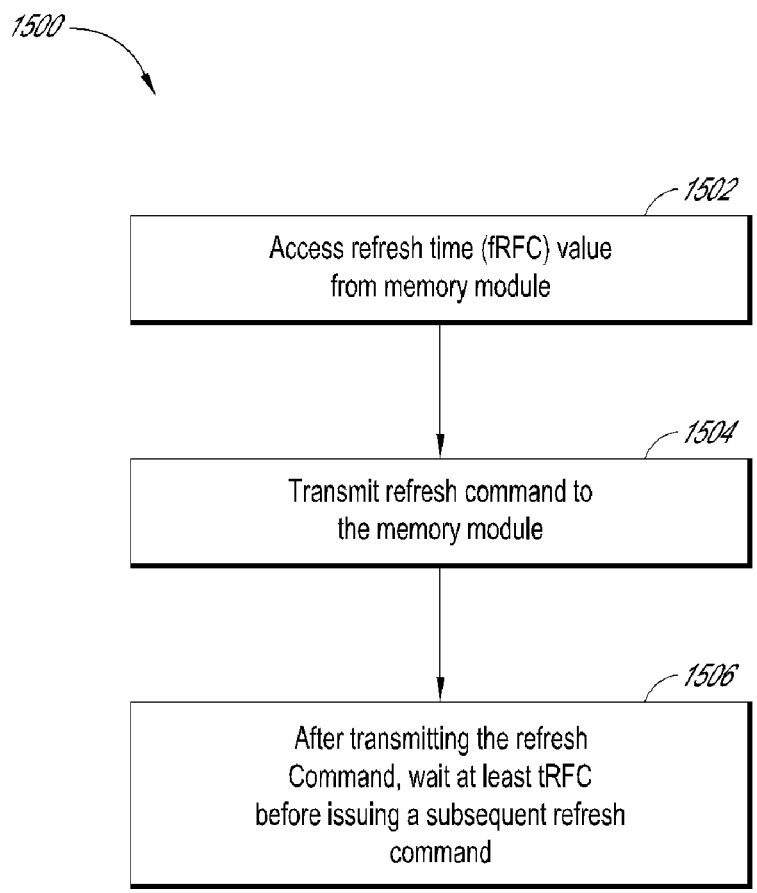

FIG. 15 shows another method 1500 of using a memory module 700 in accordance with certain embodiments described herein. At block 1502, the method 1500 can include accessing a refresh time (tRFC) value from a memory module 700 comprising a plurality of memory devices 702 arranged into one or more logical ranks 704. Each logical rank 704 may correspond to a set of at least two physical ranks 706, and the tRFC value can be based at least in part on a calculated maximum amount of time for refreshing the logical rank 704, for example.

At block 1504, the method 1500 of certain embodiments comprises transmitting a refresh command to the memory module 700 instructing the memory module 700 to refresh a logical rank 704 of the one or more logical ranks 704. The refresh command may cause the memory module 700 to initiate a refresh operation for one or more first physical ranks 706 of the set of at least two physical ranks 706 and to initiate a second refresh operation for one or more second physical ranks 706 of the set of at least two physical ranks 706. In certain embodiments, the second refresh operation is initiated after the first refresh operation.

In certain embodiments, at block 1506, after transmitting the refresh command to the memory module 700, the method 1500 further includes waiting for an amount of time corresponding to at least the tRFC value before issuing a subsequent refresh command to the memory module 700. The receiving, transmitting and waiting are performed by a memory controller 710 of a computer system 712 in certain embodiments.

Terminology/Alternative Embodiments

Embodiments have been described in connection with the accompanying drawings. However, it should be understood that the figures are not drawn to scale. Distances, angles, etc. are merely illustrative and do not necessarily bear an exact relationship to actual dimensions and layout of the devices illustrated. In addition, the foregoing embodiments have been described at a level of detail to allow one of ordinary skill in the art to make and use the devices, systems, etc. described herein. A wide variety of variation is possible. Components, elements, and/or steps can be altered, added, removed, or rearranged. While certain embodiments have been explicitly described, other embodiments will become apparent to those of ordinary skill in the art based on this disclosure.

Conditional language used herein, such as, among others, "can," "could," "might," "may," "e.g.," and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

Depending on the embodiment, certain acts, events, or functions of any of the methods described herein can be performed in a different sequence, can be added, merged, or left out all together (e.g., not all described acts or events are necessary for the practice of the method). Moreover, in certain embodiments, acts or events can be performed concurrently, e.g., through multi-threaded processing, interrupt processing, or multiple processors or processor cores, rather than sequentially.

The various illustrative logical blocks, modules, circuits, and algorithm steps described in connection with the embodiments disclosed herein can be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. The described functionality can be implemented in varying ways for each particular application, but such implementation decisions should not be interpreted as causing a departure from the scope of the disclosure.

The various illustrative logical blocks, modules, and circuits described in connection with the embodiments disclosed herein can be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor can be a microprocessor, but in the alternative, the processor can be any conventional processor, controller, microcontroller, or state machine. A processor can also be implemented as a combination of computing devices, e.g., a combination of a DSP and a microprocessor, a plurality of microprocessors, one or more microprocessors in conjunction with a DSP core, or any other such configuration.

The blocks of the methods and algorithms described in connection with the embodiments disclosed herein can be embodied directly in hardware, in a software module executed by a processor, or in a combination of the two. A software module can reside in RAM memory, flash memory, ROM memory, EPROM memory, EEPROM memory, registers, a hard disk, a removable disk, a CD-ROM, or any other form of computer-readable storage medium known in the art. An exemplary storage medium is coupled to a processor such that the processor can read information from, and write information to, the storage medium. In the alternative, the storage medium can be integral to the processor. The processor and the storage medium can reside in an ASIC. The ASIC can reside in a user terminal. In the alternative, the processor and the storage medium can reside as discrete components in a user terminal.

Certain embodiments described herein are compatible with a memory system including memory devices with various attributes (see, e.g., FIGS. 2 and 3). For example, the memory system of certain embodiments may include various data slice sizes (e.g., two, four, eight, or 16 bit data slices) and corresponding memories (e.g., memories having two, four, eight, or 16 bit data widths).

Although certain preferred embodiments and examples are discussed above, it is understood that the inventive subject matter extends beyond the specifically disclosed embodiments to other alternative embodiments and/or uses of the invention and obvious modifications and equivalents thereof. It is intended that the scope of the inventions disclosed herein should not be limited by the particular disclosed embodiments. Thus, for example, in any method or process disclosed herein, the acts or operations making up the method/process may be performed in any suitable sequence and are not necessarily limited to any particular disclosed sequence.

Various aspects and advantages of the embodiments have been described where appropriate. It is to be understood that not necessarily all such aspects or advantages may be achieved in accordance with any particular embodiment. Thus, for example, it should be recognized that the various embodiments may be carried out in a manner that achieves or optimizes one advantage or group of advantages as taught herein without necessarily achieving other aspects or advantages as may be taught or suggested herein.

What is claimed is:

1. A memory module comprising:
    a plurality of memory devices arranged into one or more logical ranks, each logical rank corresponding to a set of at least two physical ranks;
    a circuit operatively coupled to the plurality of memory devices and configured to be operatively coupled to a memory controller of a computer system to receive, for a logical rank of the one or more logical ranks, a logical rank refresh command generated by the memory controller, the circuit configured to initiate, in response to the logical rank refresh command, a first refresh operation for one or more first physical ranks of the set of at least two physical ranks and a second refresh operation for one or more second physical ranks of the set of at least two physical ranks, wherein the second refresh operation is initiated after the first refresh operation; and
    a memory location storing a refresh time (tRFC) value based at least in part on a calculated maximum amount of time for refreshing the logical rank, wherein the tRFC value is accessible by the memory controller.

2. The memory module of claim 1, wherein the memory location resides in a serial presence detect (SPD) device operatively coupled to the circuit and accessible by the memory controller, and wherein the circuit is configured to cause the tRFC value to be stored in the SPD device.

3. The memory module of claim 1, wherein the circuit is configured to calculate the tRFC value.

4. The memory module of claim 3, wherein the circuit is configured to calculate the tRFC value in response to at least a maximum amount of time it takes to refresh a physical rank, the number of physical ranks per logical rank, and a maximum number of continuous clock cycles that commands generated by the memory controller can occupy the command bus.

5. The memory module of claim 4, wherein the circuit is configured to calculate the tRFC value according to the equation:

$$tRFC = (PR\_refresh\_time * num\_PR\_per\_LR) + (bus\_wait * clk\_per)$$

where PR_refresh_time is an amount of time it takes to refresh a physical rank, num_PR_per_LR is the number of physical ranks corresponding to a logical rank, bus_wait is a maximum number of continuous clock cycles that commands generated by the memory controller can occupy the command bus, and clk_per is a system clock period.

6. The memory module of claim 5, wherein ratio of the number of physical ranks to the number of logical ranks is two.

7. The memory module of claim 3, wherein the circuit is configured to calculate the tRFC value at least in part based on a four activate window (tFAW) value.

8. The memory module of claim 7, wherein the circuit is configured to calculate the tRFC value according to the equation:

$$tRFC \geq (PR\_refresh\_time * num\_PR\_per\_LR) + (tFAW - num\_open\_slots) * clk\_per$$

where PR_refresh_time is an amount of time it takes to refresh a physical rank, num_PR_per_LR is the number of physical ranks corresponding to a logical rank, tFAW is the four activate window value, and num_open_slots is a minimum number of open slots within the tFAW in which there is not a memory controller command on the command bus, and clk_per is a system clock period.

9. The memory module of claim 1, wherein the one or more first physical ranks comprise at least two physical ranks and the one or more second physical ranks comprise of at least two physical ranks.

10. The memory module of claim 9, wherein ratio of the number of physical ranks to the number of logical ranks is 4, 8, or 16.

11. The memory module of claim 1, wherein the one or more first physical ranks comprise N physical ranks configured to be refreshed concurrently with one another and wherein the one or more second physical ranks comprise N physical ranks configured to be refreshed concurrently with one another, where N is a number greater than or equal to two.

12. The memory module of claim 11, wherein the circuit is configured to calculate the tRFC value according to the equation:

$$tRFC = \left(PR\_refresh\_time * \frac{num\_PR\_per\_LR}{N}\right) + \left(\left\lceil \frac{num\_PR\_per\_LR - 1}{N} \right\rceil * refresh\_wait\_time\right),$$

where PR_refresh_time is an amount of time it takes to refresh a physical rank, num_PR_per_LR is the number of physical ranks corresponding to a logical rank, and refresh_wait_time is an amount of delay inserted after each physical rank refresh.

13. The memory module of claim 1, wherein the memory devices are DDR memory devices and the memory module further comprises a printed circuit board configured to be operatively coupled to the memory controller, the circuit and the plurality of memory devices mounted on the printed circuit board.

14. The memory module of claim 1, wherein each logical rank comprises an address space which is mapped into an address space of a set of at least two of the plurality of physical ranks.

15. A method of using a memory module, comprising:
    providing a memory module comprising a plurality of memory devices arranged into one or more logical ranks, each logical rank corresponding to a set of at least two physical ranks;
    receiving a command to refresh a logical rank of the one or more logical ranks;
    initiating a refresh operation for one or more first physical ranks of the set of physical ranks corresponding to the logical rank in response to the command; and
    initiating a refresh operation for one or more second physical ranks of the set of physical ranks corresponding to the logical rank in response to the command; and
    storing a refresh time (tRFC) value in a memory location of the memory module, the tRFC value based at least in part on a calculated maximum amount of time for refreshing the logical rank, wherein the tRFC value is accessible by the memory controller.

16. The method of claim 15, wherein the tRFC value is calculated in response to at least a maximum amount of time it takes to refresh a physical rank, the number of physical ranks per logical rank, and a maximum number of continuous clock cycles that commands generated by the memory controller can occupy the command bus.

17. The method of claim 16, wherein the tRFC value is calculated according to the equation:

$$tRFC = (PR\_refresh\_time * num\_PR\_per\_LR) + (bus\_wait * clock\_per)$$

where PR_refresh_time is an amount of time it takes to refresh a physical rank, num_PR_per_LR is the number of physical ranks corresponding to a logical rank, bus_wait is a maximum number of continuous clock cycles that commands generated by the memory controller can occupy the command bus, and clock_per is a system clock period.

18. The method of claim 17, wherein the tRFC value is calculated at least in part based on a four activate window (tFAW) value.

19. The method of claim 18, wherein the tRFC value is calculated according to the equation:

$$tRFC \geq (PR\_refresh\_time * num\_PR\_per\_LR) + (tFAW - num\_open\_slots) * clk\_per$$

where PR_refresh_time is an amount of time it takes to refresh a physical rank, num_PR_per_LR is the number of physical ranks corresponding to a logical rank, tFAW is the four activate window value, and num_open_slots is a minimum number of open slots within the tFAW in which there is not a memory controller command on the command bus, and clk_per is a system clock period.

20. The method of claim 15, wherein the one or more first physical ranks comprise N physical ranks configured to be refreshed concurrently with one another and wherein the one or more second physical ranks comprise N physical ranks configured to be refreshed concurrently with one another, where N is a number greater than or equal to two.

21. The method of claim 20, wherein the tRFC value is calculated according to the equation:

$$tRFC = \left(PR\_refresh\_time * \frac{num\_PR\_per\_LR}{N}\right) + \left(\left\lfloor \frac{num\_PR\_per\_LR - 1}{N} \right\rfloor * refresh\_wait\_time\right)$$

where PR_refresh_time is an amount of time it takes to refresh a physical rank, num_PR_per_LR is the number of physical ranks corresponding to a logical rank, and refresh_wait_time is an amount of delay inserted after each physical rank refresh.

22. The method of claim 16, further comprising calculating the tRFC value prior to storing the tRFC value in the memory location of the memory module.

23. The method of claim 22, wherein the calculating step is performed by a circuit mounted on the memory module.

24. A method of using a memory module, comprising:
accessing a refresh time (tRFC) value from a memory module comprising a plurality of memory devices arranged into one or more logical ranks, each logical rank corresponding to a set of at least two physical ranks, the tRFC value based at least in part on a calculated maximum amount of time for refreshing the logical rank;
transmitting a refresh command to the memory module instructing the memory module to refresh a logical rank of the one or more logical ranks, the refresh command causing the memory module to initiate a refresh operation for one or more first physical ranks of the set of at least two physical ranks and to initiate a second refresh operation for one or more second physical ranks of the set of at least two physical ranks, wherein the second refresh operation is initiated after the first refresh operation; and
after transmitting the refresh command to the memory module, waiting for an amount of time corresponding to at least the tRFC value before issuing a subsequent refresh command to the memory module.

25. The method of claim 24, wherein the receiving, transmitting and waiting are performed by a memory controller of a computer system.

* * * * *